US009781832B2

(12) United States Patent
Kato et al.

(10) Patent No.: US 9,781,832 B2
(45) Date of Patent: Oct. 3, 2017

(54) LAMINATED MULTI-CONDUCTOR CABLE

(71) Applicant: Murata Manufacturing Co., Ltd., Nagaokakyo-shi, Kyoto-fu (JP)

(72) Inventors: Noboru Kato, Nagaokakyo (JP); Masahiro Ozawa, Nagaokakyo (JP); Satoshi Ishino, Nagaokakyo (JP); Jun Sasaki, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 35 days.

(21) Appl. No.: 14/480,767

(22) Filed: Sep. 9, 2014

(65) Prior Publication Data

US 2014/0376199 A1    Dec. 25, 2014

Related U.S. Application Data

(63) Continuation of application No. PCT/JP2013/052695, filed on Feb. 6, 2013.

(30) Foreign Application Priority Data

Jun. 19, 2012    (JP) .................................. 2012-137616

(51) Int. Cl.
*H01B 7/08*     (2006.01)
*H05K 1/14*     (2006.01)
(Continued)

(52) U.S. Cl.
CPC .............. *H05K 1/144* (2013.01); *H01P 3/08* (2013.01); *H01P 3/085* (2013.01); *H05K 1/0225* (2013.01);
(Continued)

(58) Field of Classification Search
CPC .. H01P 3/08; H01P 3/003; H01P 3/026; H01P 3/082; H05K 1/0225; H05K 1/0253;
(Continued)

(56) References Cited

U.S. PATENT DOCUMENTS 5,633,479 A     5/1997   Hirano
6,058,256 A *   5/2000   Mellen ................ G06F 17/5036
                                                       716/115

(Continued)

FOREIGN PATENT DOCUMENTS

JP     61-290794    * 12/1986
JP     61-290794 A   12/1986
(Continued)

OTHER PUBLICATIONS

Official Communication issued in International Patent Application No. PCT/JP2013/052695, mailed on Apr. 16, 2013.
(Continued)

*Primary Examiner* — James Wu
(74) *Attorney, Agent, or Firm* — Keating & Bennett, LLP

(57) ABSTRACT

A laminate body includes a plurality of dielectric sheets laminated together. A first ground conductor is provided in or on the laminate body. A second ground conductor is provided in or on the laminate body and located on a different layer from the first ground conductor. A signal line is provided between the ground conductors and with respect to a direction of lamination. A signal line is provided between the ground conductors and with respect to the direction of lamination and located closer to the second ground conductor than the signal line is, and the signal line has a portion extending along the signal line in a parallel-lines area when viewed from the direction of lamination. The first ground conductor has openings in the parallel-lines area, and the openings are arranged over the signal line when viewed from the direction of lamination.

21 Claims, 19 Drawing Sheets

(51) Int. Cl.
*H01P 3/08* (2006.01)
*H05K 1/02* (2006.01)
*H05K 1/03* (2006.01)
*H05K 1/11* (2006.01)
*H05K 7/14* (2006.01)

(52) U.S. Cl.
CPC ......... *H05K 1/0298* (2013.01); *H05K 1/0393* (2013.01); *H05K 1/11* (2013.01); *H05K 7/1427* (2013.01); *H05K 2201/0195* (2013.01); *H05K 2201/041* (2013.01)

(58) Field of Classification Search
CPC ......... H05K 2201/09663; H05K 1/024; H05K 1/0245; H05K 2201/09327; H01L 2224/49175; H01L 23/552; H01L 23/66; H04B 15/00; H01B 7/0823
USPC ........ 174/117 F, 117 FF, 250, 255, 261, 262; 361/749, 750; 333/161, 204, 238, 246; 439/47, 74
See application file for complete search history.

(56) References Cited

U.S. PATENT DOCUMENTS

| | | |
|---|---|---|
| 6,469,252 B1 | 10/2002 | Tanaka et al. |
| 2002/0041950 A1 | 4/2002 | Ueno et al. |
| 2012/0097433 A1 | 4/2012 | Kato et al. |

FOREIGN PATENT DOCUMENTS

| | | | |
|---|---|---|---|
| JP | 62-009697 A | 1/1987 | |
| JP | 03-250535 A | 11/1991 | |
| JP | 04-127598 A | 4/1992 | |
| JP | 04-132295 A | 5/1992 | |
| JP | 04-306507 A | 10/1992 | |
| JP | 06-203659 A | 7/1994 | |
| JP | 06-326476 A | 11/1994 | |
| JP | 08-046078 A | 2/1996 | |
| JP | 10-125144 A | 5/1998 | |
| JP | 10-302882 A | 11/1998 | |
| JP | 2001-135156 A | 5/2001 | |
| JP | 2002-118339 A | 4/2002 | |
| JP | 2002-151917 A | 5/2002 | |
| JP | 2006-292499 A | 10/2006 | |
| JP | 2006-294683 A | 10/2006 | |
| JP | 2007-123740 * | 5/2007 | |
| JP | 2007-123740 A | 5/2007 | |
| JP | 2009-277623 A | 11/2009 | |
| JP | WO 2011007660 A1 * | 1/2011 | ............. H01P 3/081 |
| WO | 2011/007660 A1 | 1/2011 | |

OTHER PUBLICATIONS

Official Communication issued in corresponding Japanese Patent Application No. 2012-137616, mailed on Apr. 9, 2013.
Official Communication issued in corresponding Japanese Patent Application No. 2012-137616, mailed on Jul. 16, 2013.
Official Communication issued in corresponding Japanese Patent Application No. 2012-137616, mailed on Oct. 8, 2013.
Official Communication issued in corresponding Japanese Patent Application No. 2012-137616, mailed on Jan. 14, 2014.

* cited by examiner

FIG. 3
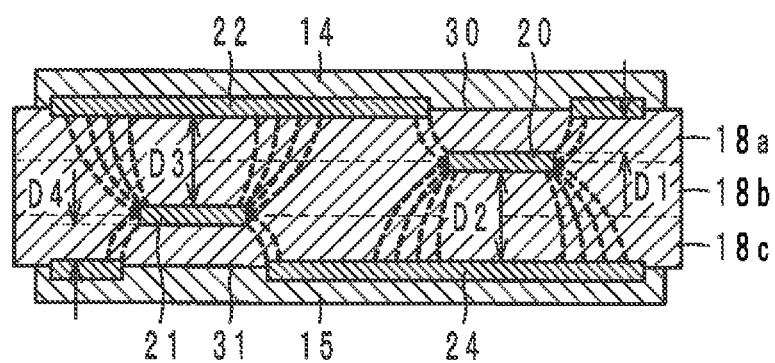
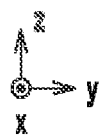

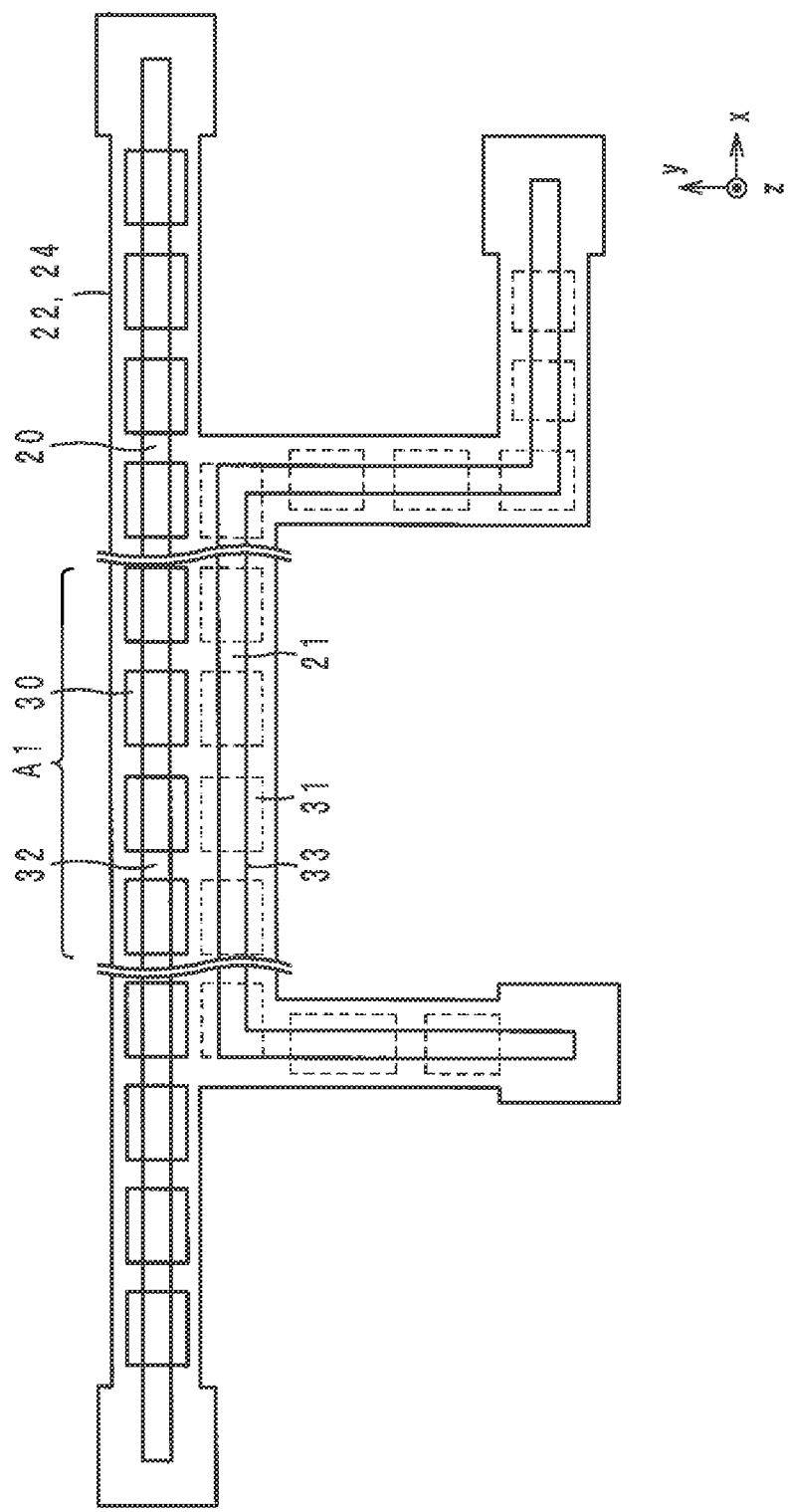

F I G. 5A
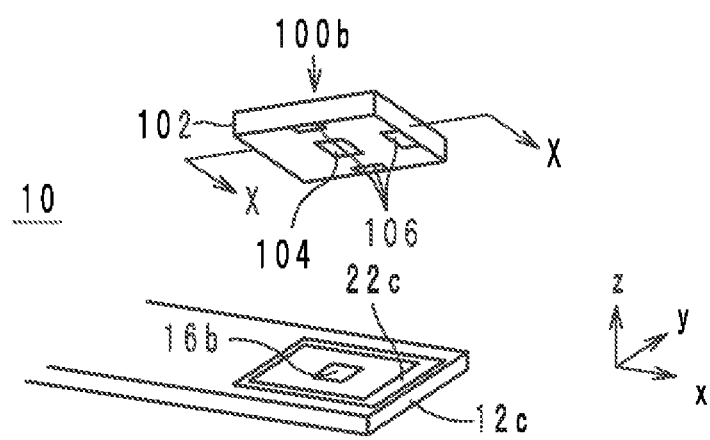
F I G. 5B
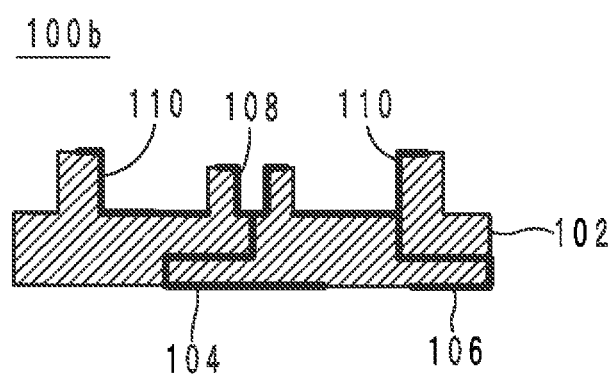

F I G. 6A
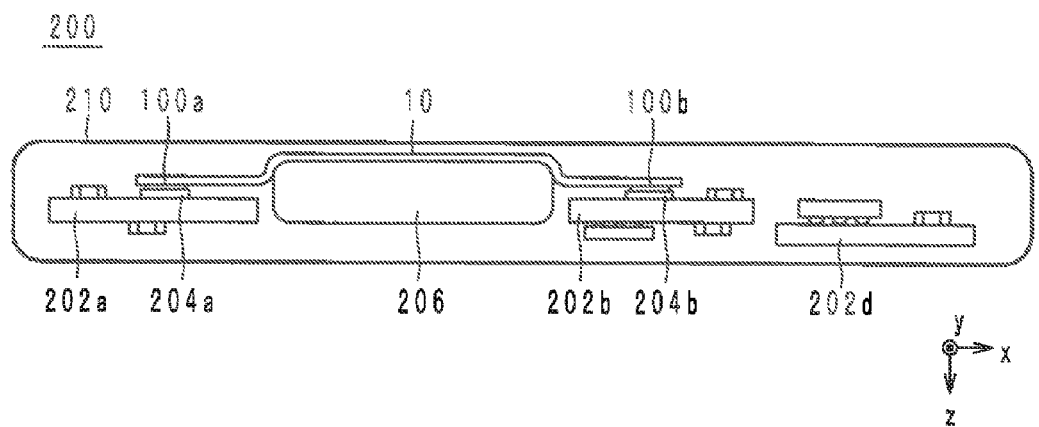
F I G. 6B
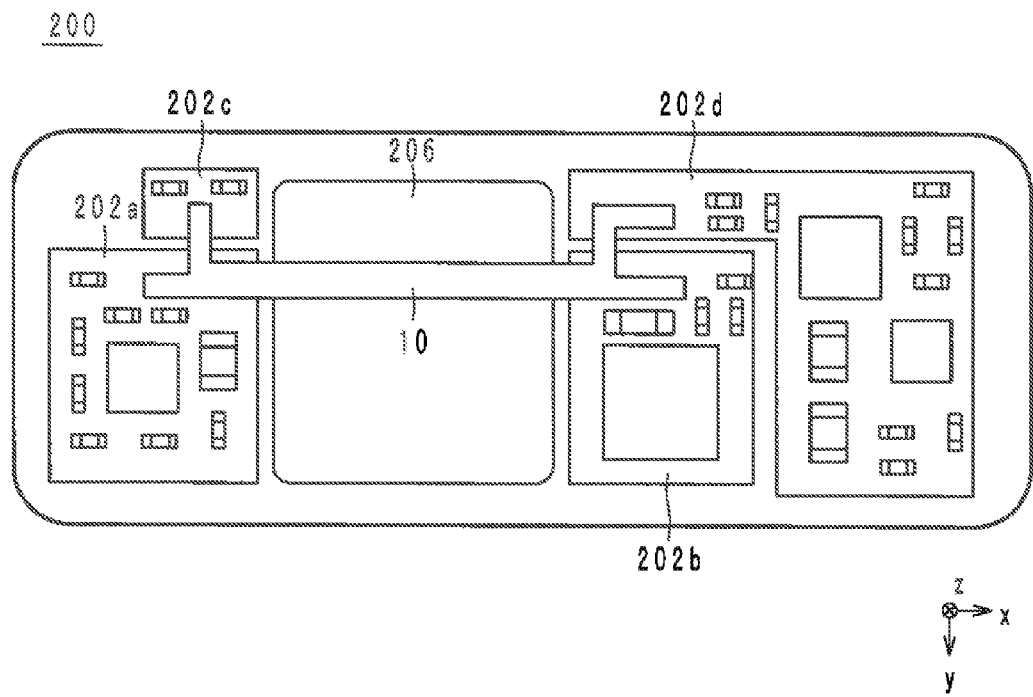

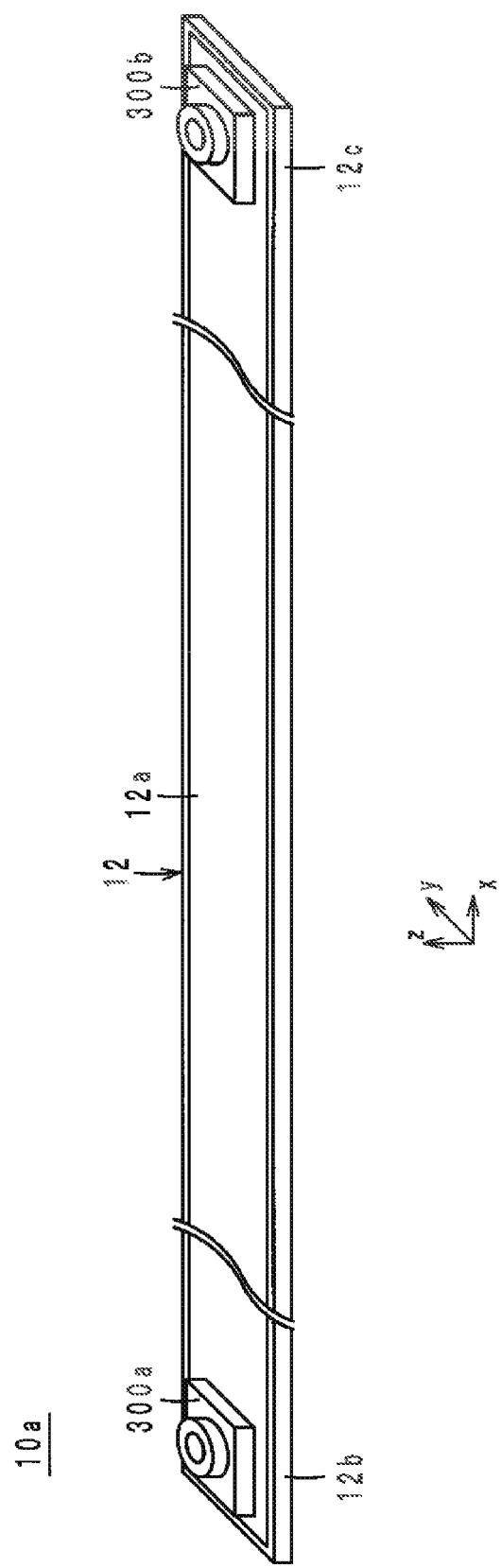

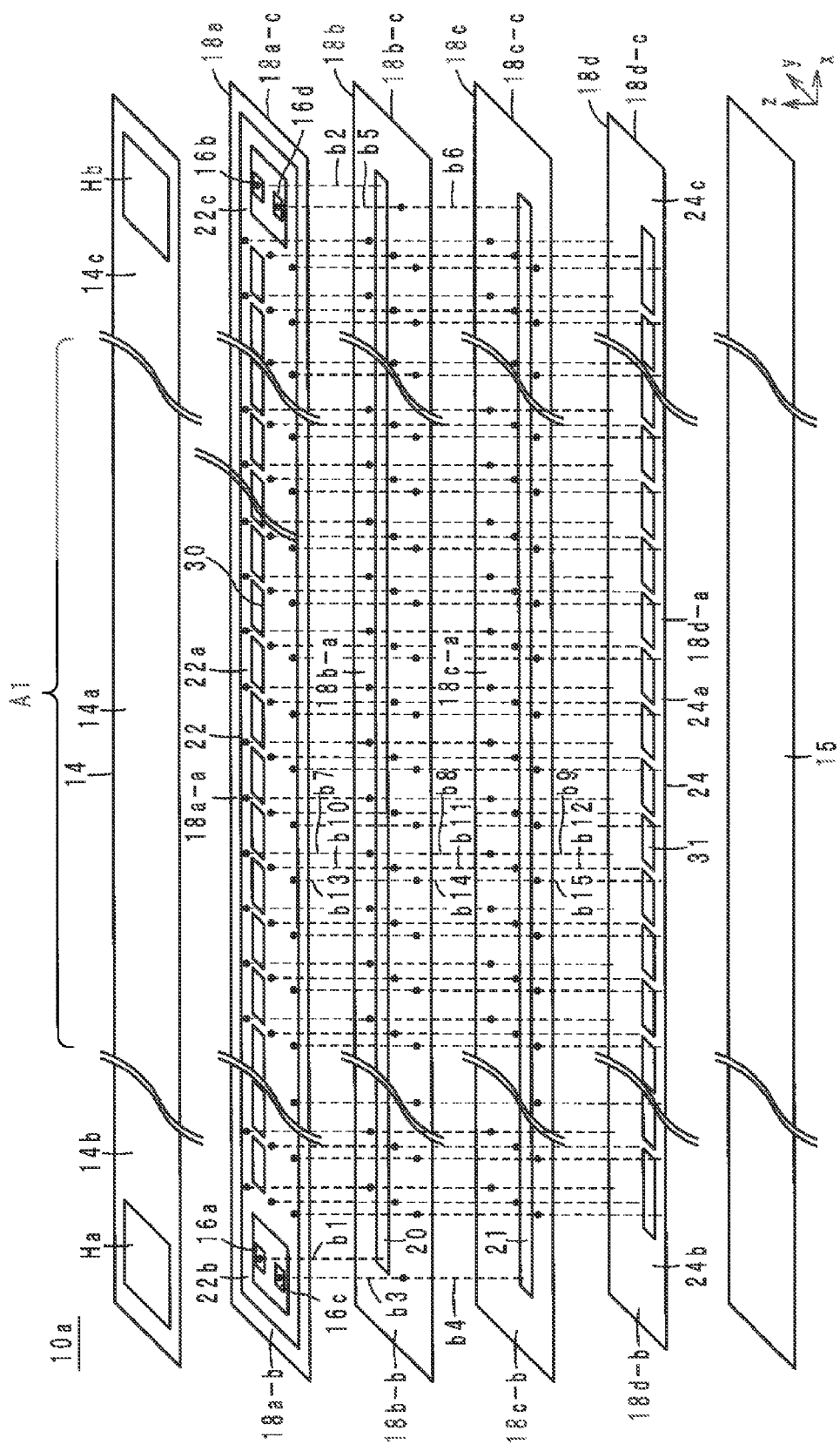

F I G . 1 0 A
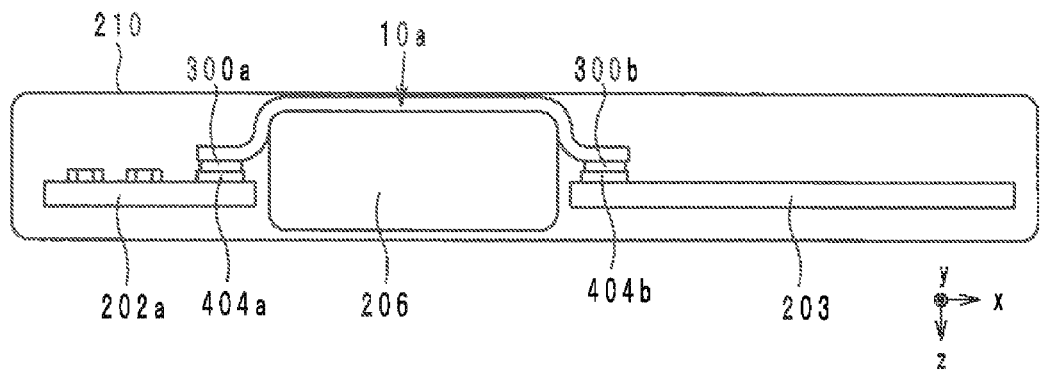
F I G . 1 0 B
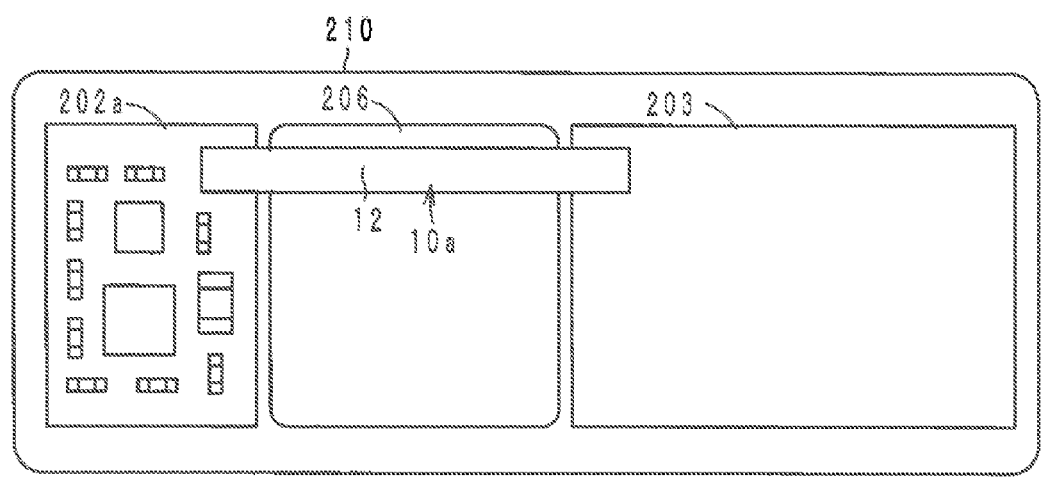

FIG. 11
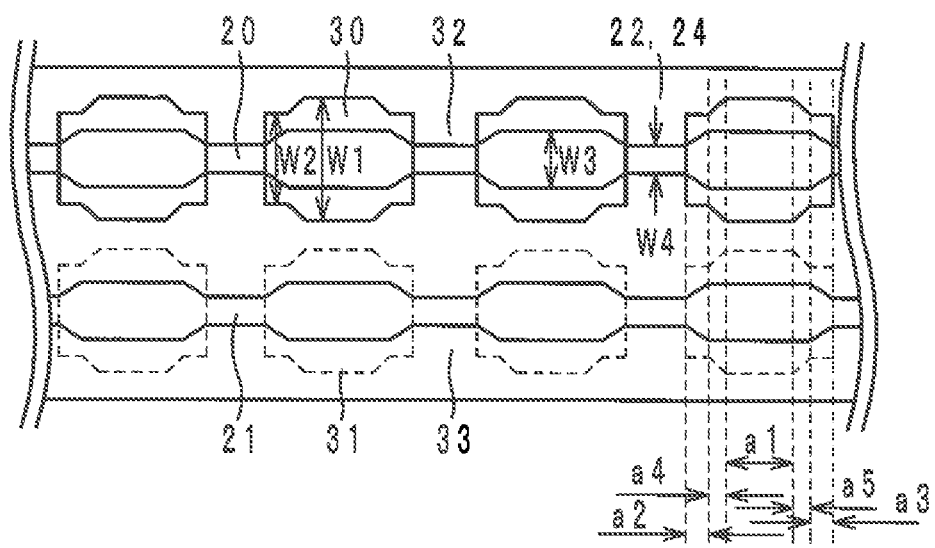
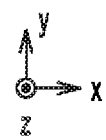

F I G . 1 5
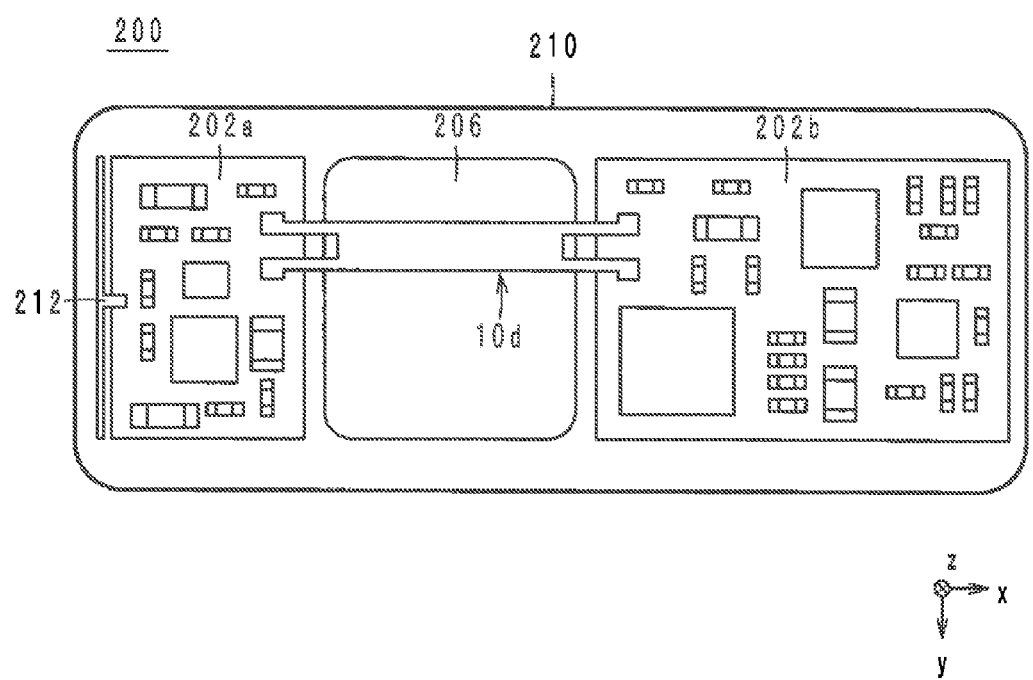

LAMINATED MULTI-CONDUCTOR CABLE

BACKGROUND OF THE INVENTION

1. Field of the Invention

The present invention relates to a laminated multi-conductor cable, and more particularly to a laminated multi-conductor cable including a plurality of signal lines preferably for use in high-frequency signal transmission.

2. Description of the Related Art

As a conventional laminated multi-conductor cable, for example, a flexible flat cable disclosed in Japanese Patent Laid-Open Publication No. 2009-277623 is known. FIG. 19 is a sectional view of the flexible flat cable 500 disclosed in Japanese Patent Laid-Open Publication No. 2009-277623.

As shown by FIG. 19, the flexible flat cable 500 includes flat conductors 502, insulating adhesive sheets 504a and 504b, and metal thin films 506a and 506b.

The flat conductors 502 are arranged side by side on the same layer at uniform intervals. The flat conductors 502 are sandwiched between the insulating adhesive sheets 504a and 504b located above and below. The metal thin film 506a is located on the top of the insulating adhesive sheet 504a. The metal thin film 506b is located underneath the insulating adhesive sheet 504b. This flexible flat cable 500 has a structure including a plurality of striplines.

In the flexible flat cable 500 disclosed in Japanese Patent Laid-Open Publication No. 2009-277623, however, the flat conductors 502 are arranged close to each other, thereby causing a problem that it is difficult to ensure isolation among the flat conductors 502.

SUMMARY OF THE INVENTION

Preferred embodiments of the present invention provide a laminated multi-conductor cable wherein isolation among a plurality of signal lines is ensured.

A laminated multi-conductor cable according to a preferred embodiment of the present invention includes a laminate body including a plurality of base material layers laminated together; a first ground conductor provided in or on the laminate body; a second ground conductor provided in or on the laminate body and located on a different layer from the first ground conductor; a first signal line provided between the first ground conductor and the second ground conductor with respect to a direction of lamination; and a second signal line provided between the first ground conductor and the second ground conductor with respect to the direction of lamination and located closer to the second ground conductor than the first signal line is, the second signal line including a portion extending along the first signal line in a specified area when viewed from the direction of lamination. In the laminated multi-conductor cable, the first ground conductor has a first opening in the specified area, and the first opening is located over the first signal line when viewed from the direction of lamination.

Various preferred embodiments of the present invention ensure isolation among a plurality of signal lines.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 3 is a sectional view of the laminated multi-conductor cable shown by FIG. 1, cut along the line X-X in FIG. 1.

FIG. 4 is a plan view of signal lines and ground conductors of the laminated multi-conductor cable shown by FIG. 1.

FIGS. 5A and 5B are a perspective view and a sectional view of a connector of the laminated multi-conductor cable.

FIGS. 6A and 6B are a plan view from y-direction and a plan view from z-direction of an electronic device including the laminated multi-conductor cable.

FIG. 7 is a perspective view of a laminated multi-conductor cable according to a first modification of a preferred embodiment of the present invention.

FIG. 8 is an exploded perspective view of the laminated multi-conductor cable according to the first modification of a preferred embodiment of the present invention.

FIGS. 10A and 10B are a plan view from y-direction and a plan view from z-direction of an electronic device including the laminated multi-conductor cable.

FIG. 11 is a plan view of signal lines and ground conductors of a laminated multi-conductor cable according to a second modification of a preferred embodiment of the present invention.

FIG. 15 is a plan view from z-direction of an electronic device including the laminated multi-conductor cable.

DETAILED DESCRIPTION OF THE PREFERRED EMBODIMENTS

Laminated multi-conductor cables according to preferred embodiments of the present invention are hereinafter described with reference to the drawings.

Figure 1:
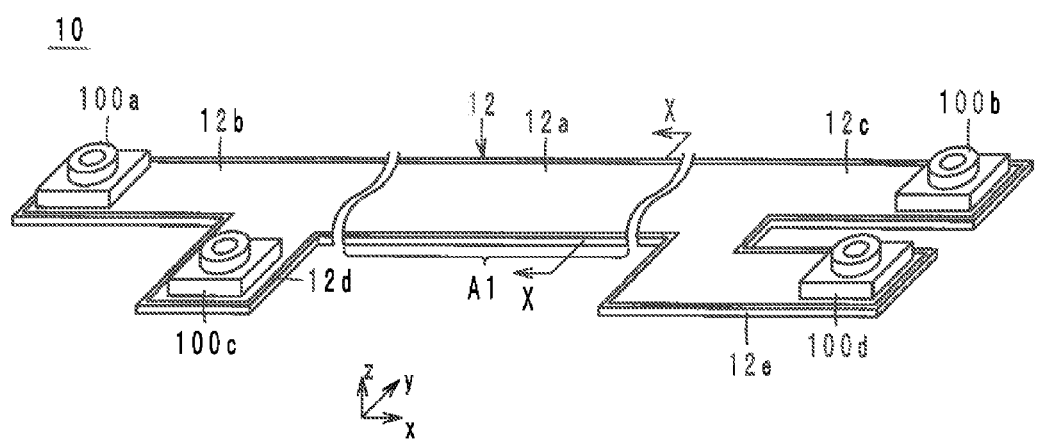
FIG. 1 is a perspective view of a laminated multi-conductor cable according to a preferred embodiment of the present invention.
Figure 2:
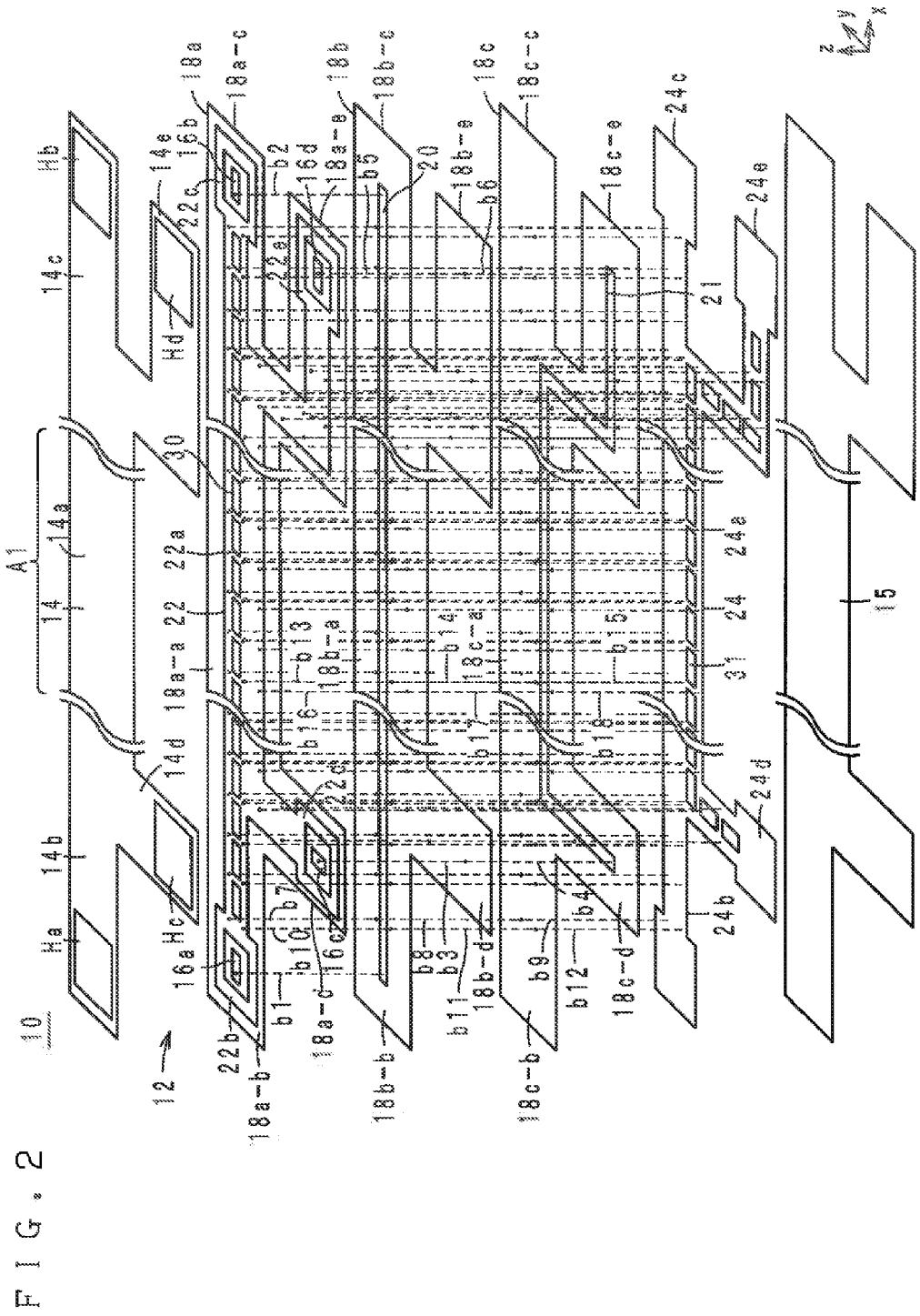
FIG. 2 is an exploded perspective view of the laminated multi-conductor cable according to a preferred embodiment of the present invention.

The structure of a laminated multi-conductor cable according to a preferred embodiment of the present invention is described with reference to the drawings. FIG. 1 is a perspective view of a laminated multi-conductor cable 10 according to a preferred embodiment of the present invention. FIG. 2 is an exploded perspective view of the laminated multi-conductor cable 10. FIG. 3 is a sectional view of the laminated multi-conductor cable 10, cut along the line X-X in FIG. 1. FIG. 4 is a plan view of signal lines 20 and 21 and ground conductors 22 and 24 of the laminated multi-conductor cable 10. In FIGS. 1 through 4, the direction of lamination of the laminated multi-conductor cable 10 is referred to as z-direction. The lengthwise direction of the laminated multi-conductor cable 10 is referred to as x-direction, and the direction perpendicular to the x-direction and the z-direction is referred to as y-direction.

As shown in FIGS. 1 and 2, the laminated multi-conductor cable 10 includes a laminate body 12, external terminals 16a through 16d, signal lines 20 and 21, ground conductors 22 and 24, connectors 100a through 100d, and via-hole conductors b1 through b18.

The laminate body 12, when viewed from the z-direction, extends in the x-direction, and includes a line portion 12a and connection portions 12b through 12e. As shown in FIG. 2, the laminate body 12 is a flexible laminate body including a preventive layer 14, dielectric sheets (base material layers) 18a through 18c, and a preventive layer 15 that are laminated in this order from a positive side to a negative side in the z-direction. In the following paragraphs, a main surface of the laminate body 12 at the positive z-direction side is referred to as a front surface, and a main surface of the laminate body 12 at the negative z-direction side is referred to as a back surface.

The line portion 12a extends in the x-direction. The connection portion 12b is a rectangular or substantially rectangular portion extending from a negative x-direction end of the line portion 12a farther in the negative x-direction. The connection portion 12c is a rectangular or substantially rectangular portion extending from a positive x-direction end of the line portion 12a farther in the positive x-direction. The connection portion 12d is a rectangular or substantially rectangular portion extending from the negative x-direction end of the line portion 12a in a negative y-direction. Thus, the connection portions 12b and 12d branch from the negative x-direction end of the line portion 12a. The connection portion 12e extends from the positive x-direction end of the line portion 12a in the negative y-direction and thereafter in the positive x-direction, and accordingly, the connection portion 12e is L-shaped. Thus, the connection portions 12c and 12e branch from the positive x-direction end of the signal portion 12a. The widths (sizes in the y-direction) of the connection portions 12b through 12e are equal or substantially equal to the width (size in the y-direction) of the line portion 12a.

The dielectric sheets 18a through 18c, when viewed from the z-direction, have the same or substantially the same shapes as the laminate body 12. The dielectric sheets 18a through 18c are preferably formed of flexible thermoplastic resin such as polyimide or the like, for example. The thicknesses after lamination of the dielectric sheets 18a through 18c preferably are, for example, within a range of about 25 μm to about 200 μm, for example. In the following paragraphs, a main surface of each of the dielectric sheets 18a through 18c at the positive z-direction side is referred to as a front surface, and a main surface of each of the dielectric sheets 18a through 18c at the negative z-direction side is referred to as a back surface.

The dielectric sheet 18a includes a line portion 18a-a, and connection portions 18a-b through 18a-e. The dielectric sheet 18b includes a line portion 18b-a, and connection portions 18b-b through 18b-e. The dielectric sheet 18c includes a line portion 18c-a, and connection portions 18c-b through 18c-e. The line portions 18a-a through 18c-a constitute the line portion 12a. The connection portions 18a-b through 18c-b constitute the connection portion 12b. The connection portions 18a-c through 18c-c constitute the connection portion 12c. The connection portions 18a-d through 18c-d constitute the connection portion 12d. The connection portions 18a-e through 18c-e constitute the connection portion 12e.

The ground conductor 22 (first ground conductor) is, as shown in FIG. 2, provided in the laminate body 12, and more specifically, provided on the front surface of the dielectric sheet 18a. The ground conductor 22, when viewed from the z-direction, has the same or substantially the same shape as the laminate body 12, and is formed of a metal material with a low specific resistance, for example, a silver-based or copper-based material.

The ground conductor 22, as shown in FIG. 2, includes a line portion 22a and terminal portions 22b through 22e. The line portion 22a is provided on the front surface of the line portion 18a-a, and is a rectangular or substantially rectangular portion extending in the x-direction.

The terminal portion 22b is, as shown in FIG. 2, provided on the front surface of the connection portion 18a-b, and is connected to a negative x-direction end of the line portion 22a. A negative x-direction end of the terminal portion 22b is like a square or substantially square frame. The terminal portion 22c is, as shown in FIG. 2, provided on the front surface of the connection portion 18a-c, and is connected to a positive x-direction end of the line portion 22a. A positive x-direction end of the terminal portion 22c is like a square or substantially square frame. The terminal portion 22d is, as shown in FIG. 2, provided on the front surface of the connection portion 18a-d, and is connected to the negative x-direction end of the line portion 22a. A negative y-direction end of the terminal portion 22d is like a square frame. The terminal portion 22e is, as shown in FIG. 2, provided on the front surface of the connection portion 18a-e, and is connected to the positive x-direction end of the line portion 22a. A positive x-direction end of the terminal portion 22e is like a square or substantially square frame.

The ground conductor 24 (second ground conductor) is, as shown in FIG. 2, provided in the laminate body 12 and located on a different layer from the ground conductor 22. More specifically, the ground conductor 24 is provided on the back surface of the dielectric sheet 18c. The ground conductor 24, when viewed from the z-direction, preferably has the same or substantially the same shape as the laminate body 12, and is formed of a metal material with a low specific resistance, for example, a silver-based or copper-based material.

The ground conductor 24, as shown in FIG. 2, includes a line portion 24a and terminal portions 24b through 24e. The line portion 22a is provided on the back surface of the line portion 18c-a, and is a rectangular or substantially rectangular portion extending in the x-direction.

The terminal portion 24b is, as shown in FIG. 2, provided on the back surface of the connection portion 18c-b, and is connected to a negative x-direction end of the line portion 24a. The terminal portion 24c is, as shown in FIG. 2, provided on the back surface of the connection portion 18c-c, and is connected to a positive x-direction end of the line portion 24a. The terminal portion 24d is, as shown in FIG. 2, provided on the back surface of the connection portion 18c-d, and is connected to the negative x-direction end of the line portion 22a. The terminal portion 24e is, as shown in FIG. 2, provided on the back surface of the connection portion 18c-e, and is connected to the positive x-direction end of the signal portion 24a.

The signal line 20 is, as shown in FIGS. 2 and 3, located between the ground conductor 22 and the ground conductor 24 with respect to the z-direction, and more specifically provided on the front surfaces of the line portion 18b-a and connection portions 18b-b and 18b-c of the dielectric sheet 18b. The signal line 20 is a linear conductor located in the positive y-direction side off from the center of the line portion 18b-a with respect to the y-direction and extending in the x-direction. The signal line 20 is, when viewed from the z-direction, covered by the ground conductors 22 and 24. Therefore, the signal line 20 and the ground conductors 22 and 24 define a stripline structure. The signal line 20 is formed of a metal material with a low specific resistance, for example, a silver-based or copper-based material.

As shown in FIG. 3, the distance D1 in the z-direction between the signal line 20 and the ground conductor 22 is smaller than the distance D2 in the z-direction between the signal line 20 and the ground conductor 24. The distance D1 is equal or substantially equal to the thickness of the dielectric sheet 18a, and the distance D2 is equal or substantially equal to the total thickness of the dielectric sheets 18b and 18c.

The signal line 21 is, as shown in FIGS. 2 and 3, located between the ground conductor 22 and the ground conductor 24 with respect to the z-direction, and the signal line 21 is located closer to the ground conductor 24 than the signal line 20 is. More specifically, the signal line 21 is provided on the front surfaces of the line portion 18c-a and connection portions 18c-b and 18c-c of the dielectric sheet 18c. The signal line 21 is a linear conductor located in the negative y-direction side off from the center of the line portion 18c-a with respect to the y-direction and extending in the x-direction. The signal line 21 is, when viewed from the z-direction, in a different position from the signal line 20. As shown in FIG. 4, when viewed from the z-direction, the signal line 21 extends along the signal line 20 in a parallel-lines area A1. The parallel-lines area A1 corresponds to the line portion 12a. The term "extends along" means to extend parallel to or slightly inclined from. The signal line 21 is, when viewed from the z-direction, covered by the ground conductors 22 and 24. Therefore, the signal line 21 and the ground conductors 22 and 24 define a stripline structure. The signal line 21 is formed of a metal material with a low specific resistance, for example, a silver-based or copper-based material.

As shown in FIG. 3, the distance D3 in the z-direction between the signal line 21 and the ground conductor 22 is greater than the distance D4 in the z-direction between the signal line 21 and the ground conductor 24. The distance D3 is equal or substantially equal to the total thickness of the dielectric sheets 18a and 18b, and the distance D4 is equal or substantially equal to the thickness of the dielectric sheet 18c.

As shown in FIG. 4, the ground conductor 22 includes a plurality of rectangular or substantially rectangular openings 30. The openings 30 are, when viewed from the z-direction, located over the signal line 20 and aligned along the signal line 20. In the ground conductor 22, portions among the openings 30 are referred to as bridges 32. Thus, the openings 30 and the bridges 32 are arranged alternately in the x-direction. The openings 30 and the bridges 32 are arranged alternately over and along the signal line 20. The bridges 32 are arranged along the signal line 20 at intervals shorter than about one half wavelength of a high-frequency signal to be transmitted through the signal line 20, for example.

Also, as shown in FIG. 4, the ground conductor 24 includes a plurality of rectangular or substantially rectangular openings 31. The openings 31 are, when viewed from the z-direction, located over the signal line 21 and aligned along the signal line 21. In the ground conductor 24, portions among the openings 31 are referred to as bridges 33. Thus, the openings 31 and the bridges 33 are arranged alternately in the x-direction. The openings 31 and the bridges 33 are arranged alternately over and along the signal line 21. The bridges 32 are arranged along the signal line at intervals shorter than about one half wavelength of a high-frequency signal to be transmitted through the signal line 21, for example.

The external terminal 16a is a rectangular or substantially rectangular conductor provided on the front surface of the connection portion 18a-b and is enclosed by the terminal portion 22b. The external terminal 16a, when viewed from the z-direction, covers a negative x-direction end of the signal line 20. The external terminal 16a is formed of a metal material with a low specific resistance, for example, a silver-based or copper-based material. The external terminal 16a preferably is preferably plated with gold, for example, for example.

The external terminal 16b is a rectangular or substantially rectangular conductor provided on the front surface of the connection portion 18a-c and is enclosed by the terminal portion 22c. The external terminal 16b, when viewed from the z-direction, covers a positive x-direction end of the signal line 20. The external terminal 16b is formed of a metal material with a low specific resistance, for example, a silver-based or copper-based material. The external terminal 16b preferably is preferably plated with gold, for example, for example.

The external terminal 16c is a rectangular or substantially rectangular conductor provided on the front surface of the connection portion 18a-d and is enclosed by the terminal portion 22d. The external terminal 16c, when viewed from the z-direction, covers a negative x-direction end of the signal line 21. The external terminal 16c is formed of a metal material with a low specific resistance, for example, a silver-based or copper-based material. The external terminal 16c is preferably plated with gold, for example.

The external terminal 16d is a rectangular or substantially rectangular conductor provided on the front surface of the connection portion 18a-e and is enclosed by the terminal portion 22e. The external terminal 16d, when viewed from the z-direction, covers a positive x-direction end of the signal line 21. The external terminal 16d is formed of a metal material with a low specific resistance, for example, a silver-based or copper-based material. The external terminal 16d is preferably plated with gold, for example.

The via-hole conductor b1 is pierced in the connection portion 18a-b of the dielectric sheet 18a in the z-direction. A positive z-direction end of the via-hole conductor b1 is connected to the external terminal 16a, and a negative z-direction end of the via-hole conductor b1 is connected to the negative x-direct ion end of the signal line 20.

The via-hole conductor b2 is pierced in the connection portion 18a-c of the dielectric sheet 18a in the z-direction. A positive z-direction end of the via-hole conductor b2 is connected to the external terminal 16b, and a negative z-direction end of the via-hole conductor b2 is connected to the positive x-direction end of the signal line 20. As a result, the signal line 20 is connected between the external terminals 16a and 16b.

The via-hole conductor b3 is pierced in the connection portion 18a-d of the dielectric sheet 18a in the z-direction.

The via-hole conductor b4 is pierced in the connection portion 18b-d of the dielectric sheet 18b in the z-direction. The via-hole conductors b3 and b4 are connected to each other to form a via-hole conductor. A positive z-direction end of the via-hole conductor b3 is connected to the external terminal 16c, and a negative z-direction end of the via-hole conductor b4 is connected to the negative x-direction end of the signal line 21.

The via-hole conductor b5 is pierced in the connection portion 18a-e of the dielectric sheet 18a in the z-direction. The via-hole conductor b6 is pierced in the connection portion 18b-e of the dielectric sheet 18b in the z-direction. The via-hole conductors b5 and b6 are connected to each other to form a via-hole conductor. A positive z-direction end of the via-hole conductor b5 is connected to the external terminal 16d, and a negative z-direction end of the via-hole conductor b6 is connected to the positive x-direction end of the signal line 21.

The via-hole conductors b7 are pierced in the line portion 18a-a and connection portions 18a-b and 18a-c of the dielectric sheet 18a in the z-direction. When viewed from the z-direction, the via-hole conductors b7 are located in the positive y-direction side of the signal line 20 and aligned in the x-direction. The via-hole conductors b8 are pierced in the line portion 18b-a and connection portions 18b-b and 18b-c of the dielectric sheet 18b in the z-direction. When viewed from the z-direction, the via-hole conductors b8 are located in the positive y-direction side of the signal line 20 and aligned in the x-direction. The via-hole conductors b9 are pierced in the line portion 18c-a and connection portions 18c-b and 18c-c of the dielectric sheet 18c in the z-direction. When viewed from the z-direction, the via-hole conductors b9 are located in the positive y-direction side of the signal line 20 and aligned in the x-direction. Each series of via-hole conductors b7 through b9 connected one after another defines a via-hole conductor. Positive z-direction ends of the via-hole conductors b7 are connected to the ground conductor 22. Negative z-direction ends of the via-hole conductors b9 are connected to the ground conductor 24.

The via-hole conductors b10 are pierced in the line portion 18a-a and connection portions 18a-b and 18a-c of the dielectric sheet 18a in the z-direction. When viewed from the z-direction, the via-hole conductors b10 are located in the negative y-direction side of the signal line 20 and aligned in the x-direction. The via-hole conductors b11 are pierced in the line portion 18b-a and connection portions 18b-b and 18b-c of the dielectric sheet 18b in the z-direction. When viewed from the z-direction, the via-hole conductors b11 are located in the negative y-direction side of the signal line 20 and aligned in the x-direction. The via-hole conductors b12 are pierced in the line portion 18c-a and connection portions 18c-b and 18c-c of the dielectric sheet 18c in the z-direction. When viewed from the z-direction, the via-hole conductors b10 are located in the negative y-direction side of the signal line 20 and aligned in the x-direction. Each series of via-hole conductors b10 through b12 connected one after another defines a via-hole conductor. Positive z-direction ends of the via-hole conductors b10 are connected to the ground conductor 22. Negative z-direction ends of the via-hole conductors b12 are connected to the ground conductor 24.

The via-hole conductors b13 are pierced in the line portion 18a-a and connection portions 18a-d and 18a-e of the dielectric sheet 18a in the z-direction. When viewed from the z-direction, the via-hole conductors b13 are located in the positive y-direction side of the signal line 21 and aligned in the x-direction. The via-hole conductors b14 are pierced in the line portion 18b-a and connection portions 18b-d and 18b-e of the dielectric sheet 18a in the z-direction. When viewed from the z-direction, the via-hole conductors b14 are located in the positive y-direction side of the signal line 21 and aligned in the x-direction. The via-hole conductors b15 are pierced in the line portion 18c-a and connection portions 18c-d and 18c-e of the dielectric sheet 18c in the z-direction. When viewed from the z-direction, the via-hole conductors b15 are located in the positive y-direction side of the signal line 21 and aligned in the x-direction. Each series of via-hole conductors b13 through b15 connected one after another defines a via-hole conductor. Positive z-direction ends of the via-hole conductors b13 are connected to the ground conductor 22. Negative z-direction ends of the via-hole conductors b15 are connected to the ground conductor 24.

The via-hole conductors b16 are pierced in the line portion 18a-a and connection portions 18a-d and 18a-e of the dielectric sheet 18a in the z-direction. When viewed from the z-direction, the via-hole conductors b16 are located in the negative y-direction side of the signal line 21 and aligned in the x-direction. The via-hole conductors b17 are pierced in the line portion 18b-a and connection portions 18b-d and 18b-e of the dielectric sheet 18b in the z-direction. When viewed from the z-direction, the via-hole conductors b17 are located in the negative y-direction side of the signal line 21 and aligned in the x-direction. The via-hole conductors b18 are pierced in the line portion 18c-a and connection portions 18c-d and 18c-e of the dielectric sheet 18c in the z-direction. When viewed from the z-direction, the via-hole conductors b18 are located in the negative y-direction side of the signal line 21 and aligned in the x-direction. Each series of via-hole conductors b16 through b18 connected one after another defines a via-hole conductor. Positive z-direction ends of the via-hole conductors b16 are connected to the ground conductor 22. Negative z-direction ends of the via-hole conductors b18 are connected to the ground conductor 24. Thus, the ground conductors 22 and 24 are connected to each other by the via-hole conductors b7 through b18.

The via-hole conductors b1 through b18 are formed of a metal material with a low specific resistance, for example, a silver-based or a copper-based material. Instead of the via-hole conductors b1 through b18, through holes, each having a conductive layer such as a plated layer on its inner surface, may be used.

The preventive layer 14 covers substantially the entire front surface of the dielectric sheet 18a. Accordingly, the preventive layer 14 covers the ground electrode 22. The preventive layer 14 is formed of flexible resin, for example, a resist material.

The preventive layer 14, as shown in FIG. 2, includes a line portion 14a and connection portions 14b through 14e. The line portion 14a covers the entire front surface of the line portion 18a-a and accordingly covers the line portion 22a.

The connection portion 14b is connected to a negative x-direction end of the line portion 14a, and covers the front surface of the connection portion 18a-b. The connection portion 14b, however, has a rectangular or substantially rectangular opening Ha. The external terminal 16a and the terminal portion 22b are exposed to outside through the opening Ha. The terminal portion 22b is exposed to outside through the opening Ha and thus defines and functions as an external terminal.

The connection portion 14c is connected to a positive x-direction end of the line portion 14a, and covers the front surface of the connection portion 18a-c. The connection portion 14b, however, has a rectangular or substantially rectangular opening Hb. The external terminal 16b and the terminal portion 22c are exposed to outside through the opening Hb. The terminal portion 22c is exposed to outside through the opening Ha and thus defines and functions as an external terminal.

The connection portion 14d is connected to the negative x-direction end of the line portion 14a, and covers the front surface of the connection portion 18a-d. The connection portion 14d, however, has a rectangular or substantially rectangular opening Hc. The external terminal 16c and the terminal portion 22d are exposed to outside through the opening Hc. The terminal portion 22d is exposed to outside through the opening Hc and thus defines and functions as an external terminal.

The connection portion 14e is connected to the positive x-direction end of the line portion 14a, and covers the front surface of the connection portion 18a-e. The connection portion 14e, however, has a rectangular or substantially rectangular opening Hd. The external terminal 16d and the terminal portion 22e are exposed to outside through the opening Hd. The terminal portion 22e is exposed to outside through the opening Hd and thus defines and functions as an external terminal.

The preventive layer 15 covers almost the entire back surface of the dielectric sheet 18c. Accordingly, the preventive layer 15 covers the ground electrode 24. The preventive layer 15 is formed of flexible resin, for example, a resist material.

The connectors 100a and 100b are mounted on the front surface of the connection portions 12b and 12c, respectively, and are electrically connected to the signal line 20 and the ground conductors 22 and 24. The connectors 100c and 100d are mounted on the front surfaces of the connection portions 12d and 12e, respectively, and are electrically connected to the signal line 21 and the ground conductors 22 and 24. The connectors 100a through 100d have the same structure, and in the following, the structure of the connector 100b is described as an example. FIGS. 5A and 5B are a perspective view and a sectional view of the connector 100b of the laminated multi-conductor cable 10.

The connector 100b, as shown in FIGS. 5A and 5B, includes a connector body 102, external terminals 104 and 106, a central conductor 108, and an external conductor 110. The configuration of the connector body 102 is a rectangular or substantially rectangular plate with a cylinder joined thereon, and the connector body 102 is formed of an insulating material such as resin.

The external terminal 104 is located on a surface of the connector body 102 at the negative z-direction side so as to face the external terminal 16b. The external terminals 106 are located on the surface of the connector body 102 at the negative z-direction side so as to face the terminal portion 22c exposed through the opening Hb.

The central conductor 108 is located in the center of the cylinder of the connector body 102 and is connected to the external terminal 104. The central conductor 108 is a signal terminal for an input or an output of a high-frequency signal to or from the signal line 20.

The external conductor 110 is located in the cylinder of the connector body 102 and is connected to the external terminals 106. The external conductor 110 is a ground terminal of which potential is maintained at the ground potential.

The connector 100b having the structure above is mounted on the front surface of the connection portion 12c such that the external terminal 104 is connected to the external terminal 16b and such that the external terminals 106 are connected to the terminal portion 22c. As a result, the signal line 20 is electrically connected to the central conductor 108, and the ground conductors 22 and 24 are electrically connected to the external conductor 110.

The laminated multi-conductor cable 10 preferably is used in the following way. FIGS. 6A and 6B are a plan view from the y-direction and a plan view from the z-direction of an electronic device 200 using the laminated multi-conductor cable 10.

The electronic device 200 includes the laminated multi-conductor cable 10, circuit boards 202a through 202d, receptacles 204a through 204d (the receptacles 204c and 204d not shown), a battery pack (metal object) 206, and a case 210.

The battery pack 206 is, for example, a lithium-ion secondary battery, and the surface of the battery pack 206 is covered by a metal cover. The circuit board 202a, the battery pack 206 and the circuit board 202b are arranged in this order from the negative side to the positive side in the x-direction. The circuit board 202c is located in the negative y-direction side of the circuit board 202a. The circuit board 202d is located in the negative x-direction side of the circuit board 202b.

The front surface of the laminate body 12 (specifically, the preventive layer 14) contacts with the battery pack 206. The front surface of the laminate body 12 is fixed to the battery pack 206 by an adhesive or the like.

The receptacles 204a through 204d are located on respective main surfaces of the circuit boards 202a through 202d at the negative z-direction side. The connectors 100a through 100d are connected to the receptacles 204a through 204d respectively. As a result, a high-frequency signal having a frequency, for example, within a range of about 0.8 GHz to about 5 GHz transmitted between the circuit boards 202a and 202b is applied to the central conductors 108 of the connectors 100a and 100b through the receptacles 204a and 204b. Also, a high-frequency signal having a frequency, for example, within a range of about 0.8 GHz to about 5 GHz transmitted between the circuit boards 202c and 202d is applied to the central conductors 108 of the connectors 100c and 100d through the receptacles 204c and 204d. The respective external terminals 110 of the connectors 100a through 100d are maintained at the ground potential through the circuit boards 202a through 202d. In this way, the laminate multi-conductor cable 10 connects the circuit boards 202a and 202b to each other and connects the circuit board 202c and 202d to each other.

The main surface of the battery pack 206 at the negative z-direction side is on a different level from the receptacles 204a through 204d. Therefore, the both end portions of the line portion 12a of the laminate body 12 are bent such that the connectors 100a through 100d can be connected to the receptacles 204a through 204d respectively.

With reference to FIG. 2, a non-limiting example of a method of manufacturing the laminated multi-conductor cable 10 is described below. In the following, a method of manufacturing one laminated multi-conductor cable 10 is described as a non-limiting example. Practically, however, by laminating large-size dielectric sheets and thereafter cutting the laminate, a plurality of laminated multi-conductor cables are produced at one time.

First, two dielectric sheets formed of thermoplastic resin and having copper foils formed entirely on their respective front surfaces are prepared as the dielectric sheets 18a and 18b. A dielectric sheet formed of thermoplastic resin and having copper foils formed entirely on its front and back surfaces is prepared as the dielectric sheet 18c. The surfaces of the copper foils on the dielectric sheets 18a through 18c are, for example, galvanized for corrosion proof and thus are smoothened. The thicknesses of the copper foils are preferably within a range of about 10 µm to about 20 µm, for example.

Next, the external terminals 16a through 16d and the ground conductor 22 are formed on the dielectric sheet 18a as shown in FIG. 2 by photolithography. Specifically, resists having identical shapes to the external terminals 16a through 16d and the ground conductor 22 are printed on the copper foil on the front surface of the dielectric sheet 18a. Then, the copper foil is etched, so that the portions of the copper foil not covered by the resists are removed. Thereafter, the resists are removed. In this way, the external terminals 16a through 16d and the ground conductor 22 are formed on the front surface of the dielectric sheet 18a as shown in FIG. 2.

Next, the signal line 20 is formed on the front surface of the dielectric sheet 18b as shown in FIG. 2 by photolithography. The signal line 21 is formed on the front surface of the dielectric sheet 18c as shown in FIG. 2 by photolithography. The ground conductor 24 is formed on the back surface of the dielectric sheet 18c as shown in FIG. 2 by photolithography. The processes for forming the signal lines 20, 21 and the ground conductor 24 are the same as the process for forming the external terminals 16a through 16d and the ground conductor 22, and descriptions of the processes are omitted.

Next, the back surfaces of the dielectric sheets 18a through 18c are exposed to laser beams such that through holes are made in the dielectric sheets 18a through 18c at the positions of the via-hole conductors b1 through b18. Thereafter, conductive paste is filled in the through holes.

Next, the dielectric sheets 18a through 18c are laminated in this order from the positive side to the negative side in the z-direction. Heat and pressure are applied to the laminated dielectric sheets 18a through 18c from the positive and negative z-directions. Thus, the dielectric sheets 18a through 18c are softened and pressure-bonded together, and the conductive paste filled in the through holes is hardened to form into the via-hole conductors b1 through b18 shown in FIG. 2. It is not always necessary that the through holes for the via-hole conductors b1 through b18 are wholly filled with conductive paste, and for example, it may be sufficient to form conductors on the respective inner surfaces of the through holes.

Lastly, resin (resist) paste is applied to the front surface of the dielectric sheet 18a and the back surface of the dielectric sheet 18c, and thus, the preventive layers 14 and 15 are formed.

In the laminated multi-conductor cable 10 having the structure above, isolation between the two signal lines 20 and 21 are ensured. More specifically, in the flexible flat cable 500 disclosed by Japanese Patent Laid-Open Publication No. 2009-277623, the flat conductors 502 are provided on the same layer, and therefore, the flexible flat cable 500 has a problem that it is difficult to ensure isolation between the flat conductors 502.

In order to solve this problem, in the laminated multi-conductor cable 10, the signal lines 20 and 21 are provided on different layers. Therefore, the distance between the signal lines 20 and 21 in the laminated multi-conductor cable 10 is greater than the distance between the flat conductors 502 in the flexible flat cable 500. Accordingly, the capacitance induced between the signal lines 20 and 21 is smaller than the capacitance induced between the flat conductors 502. Thus, the risk of noise propagation between the signal lines 20 and 21 is diminished or prevented. Thus, the isolation in the laminated multi-conductor cable 10 is ensured compared with the isolation in the flexible flat cable 500. Especially when the two signal lines 20 and 21 are digital signal lines for differential transmission, the risk of crosstalk between the signal lines 20 and 21 is diminished or prevented.

In the laminated multi-conductor cable 10, the isolation between the signal lines 20 and 21 is ensured also for the reason below. In the laminated multi-conductor cable 10, the openings 30 of the ground conductor 22 are, when viewed from the z-direction, arranged over the signal line 20. Therefore, less capacitance is induced between the signal line 20 and the ground conductor 22, and it is less likely that noise radiated from the signal line 20 is transmitted to the ground conductor 22. Consequently, it is less likely that the noise radiated from the signal line 20 is transmitted to the signal line 21 through the ground conductor 22. Thus, in the laminated multi-conductor cable 10, the isolation is further ensured.

In the laminated multi-conductor cable 10, also, the openings 31 of the ground conductor 24 are, when viewed from the z-direction, arranged over the signal line 21. Therefore, less capacitance is induced between the signal line 20 and the ground conductor 24, and it is less likely that noise radiated from the signal line 21 is transmitted to the ground conductor 24. Consequently, it is less likely that the noise radiated from the signal line 21 is transmitted to the signal line 20 through the ground conductor 24. Thus, in the laminated multi-conductor cable 10, the isolation is further ensured.

The laminate body 12 of the laminated multi-conductor cable 10 preferably is made thinner. Specifically, in the laminated multi-conductor cable 10, the ground conductor 22 has the openings 30 arranged over the signal line 20 when viewed from the z-direction. Thus, less capacitance is induced between the signal line 20 and the ground conductor 22. Therefore, it is possible to shorten the distance D1 between the signal line 20 and the ground conductor 22 without increasing the capacitance between the signal line 20 and the ground conductor 22. Thus, it is possible to shorten the distance between the signal line 20 and the ground conductor 22 to make the laminate body 12 thinner without decreasing the characteristic impedance of the signal line 20.

The laminate body 12 of the laminated multi-conductor cable 10 can be made thinner also for the reason below. Specifically, in the laminated multi-conductor cable 10, the ground conductor 24 has the openings 31 arranged over the signal line 21 when viewed from the z-direction. Thus, less capacitance is induced between the signal line 21 and the ground conductor 24. Therefore, it is possible to shorten the distance D4 between the signal line 21 and the ground conductor 24 without increasing the capacitance between the signal line 21 and the ground conductor 24. Thus, it is possible to shorten the distance between the signal line 21 and the ground conductor 24 to make the laminate body 12 thinner without decreasing the characteristic impedance of the signal line 21. By making the laminate body 12 thinner, the laminated multi-conductor cable 10 becomes more flexible.

As thus far described, in the laminated multi-conductor cable 10, the ground conductor 22 has the openings 30 arranged over the signal line 20, and the ground conductor 24 has the openings 31 arranged over the signal line 21. This arrangement permits both ensuring of isolation and thinning of the laminate body 12.

In the laminated multi-conductor cable 10, the risk of radiation of low-frequency noise from the signal line 20 is diminished or prevented. Specifically, in the laminated multi-conductor cable 10, when viewed from the z-direction, the openings 30 and the bridges 32 are arranged alternately over the signal line 20. Thus, the characteristic impedance Z1 of the signal line 20 at portions crossing the openings 30 is smaller than the characteristic impedance Z2 at portions covered by the bridges 32. Accordingly, the characteristic impedance of the signal line 20 changes cyclically between the value Z1 and the value Z2. Consequently, standing wave with a short wavelength (that is, with a high frequency) occurs in the region of the signal line 20 where the brides 32 are arranged. On the other hand, it is less likely that standing wave with a long wavelength (that is, with a low frequency) occurs in the portions of the signal line 20 covered by the external terminals 16a and 16b. Thus, in the laminated multi-conductor cable 10, the risk of radiation of low-frequency noise from the signal line 20 is diminished or prevented. In the laminated multi-conductor cable 10, further, the risk of radiation of low-frequency noise from the signal line 21 is diminished or prevented for the same reason.

In the laminated multi-conductor cable 10, due to the standing wave generated between the signal line 20 and each of the bridges 32, high-frequency noise occurs. However, by setting the intervals among the bridges 32 to a sufficiently small value, the frequency of the noise can be set to a value outside the band of the high-frequency signal to be transmitted through the signal line 20. In this regard, it is necessary that the bridges 32 are arranged along the signal line 20 at intervals shorter than a half wavelength of the high-frequency signal to be transmitted through the signal line 20. For the same reason, it is necessary that the bridges 32 are arranged along the signal line 21 at intervals shorter than a half wavelength of the high-frequency signal to be transmitted through the signal line 21.

Further, in the laminated multi-conductor cable 10, it is preferred that the characteristic impedance Z3 of the signal line 20 at both ends is a value between the characteristic impedance Z1 of the signal line 20 at the portions crossing the openings 30 and the characteristic impedance Z2 of the signal line 20 at the portions covered by the bridges 32. Thus, it is more likely that standing wave with a short wavelength occurs in the region of the signal line 20 where the bridges 32 are arranged, and it is less likely that standing wave with a long wavelength occurs at both ends of the signal line 20. Thus, in the laminated multi-conductor cable 10, the risk of low-frequency noise is effectively diminished or prevented. Further, for the same reason, it is preferred that the characteristic impedance Z6 of the signal line 21 at both ends is a value between the characteristic impedance Z4 of the signal line 21 at portions crossing the openings 31 and the characteristic impedance Z5 of the signal line 21 at portions covered by the bridges 33.

When the signal lines 20 and 21 are used as a pair wire for differential transmission, the eye pattern is kept within the desired range.

When the signal lines 20 and 21 are used for transmissions of different kinds of high-frequency signals (for example, GSM (trade name) 900 and GSM (trade name) 1800), isolation from each other is secured.

First Modification

Next, a laminated multi-conductor cable 10a according to a first modification of a preferred embodiment of the present invention is described with reference to the drawings. FIG. 7 is a perspective view of the laminated multi-conductor cable 10a according to the first modification. FIG. 8 is an exploded perspective view of the laminated multi-conductor cable 10a according to the first modification.

As shown in FIGS. 7 and 8, the laminated multi-conductor cable 10a is different from the laminated multi-conductor cable in that the laminated multi-conductor cable 10a has a rectangular or substantially rectangular shape extending in the x-direction. In sum, the laminated multi-conductor cable 10a does not branch.

Figure 9A:
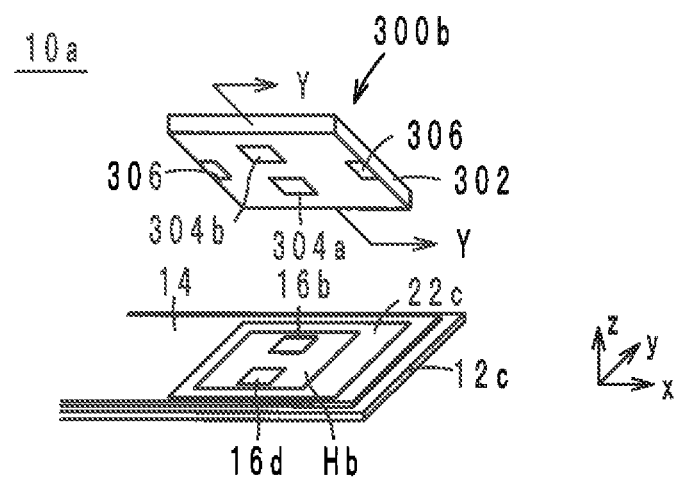
FIGS. 9A and 9B are a perspective view and a sectional view of a connector of the laminated multi-conductor cable.
Figure 9B:
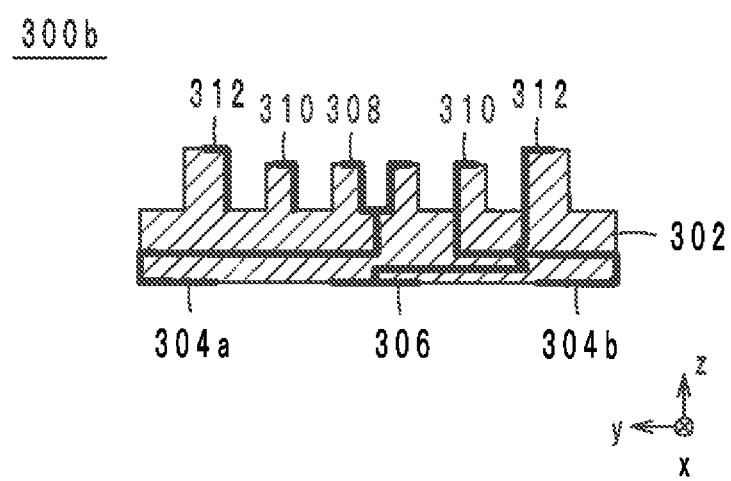

In the laminated multi-conductor cable 10a, connectors 300a and 300b are used instead of the connectors 100a through 100d. The connectors 300a and 300b are mounted on the front surfaces of the connection portions 12b and 12c respectively. The connectors 300a and 300b are electrically connected to the signal lines 20 and 21 and the ground conductors 22 and 24. The connectors 300a and 300b have the same structure, and the structure of the connector 300b is described below as an example. FIGS. 9A and 9B are a perspective view and a sectional view of the connector 300b of the laminated multi-conductor cable 10a.

The connector 300b, as shown in FIGS. 7, 9A and 9B, includes a connector body 302, external terminals 304a, 304b and 306, central conductors 308 and 310, and an external conductor 312. The configuration of the connector body 302 is a rectangular or substantially rectangular plate with a cylinder joined thereon, and the connector body 302 is formed of an insulating material such as resin.

The external terminal 304a is located on a surface of the connector body 302 at the negative z-direction side so as to face the external terminal 16b. The external terminal 304b is located on the surface of the connector body 302 at the negative z-direction side so as to face the external terminal 16d. The external terminals 306 are located on the surface of the connector body 302 at the negative z-direction side so as to face the terminal portion 22c exposed through the opening Hb.

The central conductor 308 is located in the center of the cylinder of the connector body 302 and is connected to the external terminal 304a. The central conductor 308 is a signal terminal for an input or an output of a high-frequency signal to or from the signal line 20.

The central conductor 310 is located in an inner cylinder of the connector body 302 and is connected to the external terminal 304b. The central conductor 310 is a signal terminal for an input or an output of a high-frequency signal to or from the signal line 21.

The external conductor 312 is located on the inner surface of an outer cylinder of the connector body 302 and is connected to the external terminals 306. The external conductor 312 is a ground terminal of which potential is maintained at the ground potential.

The connector 300b having the structure above is mounted on the front surface of the connection portion 12c such that the external terminal 304a is connected to the external terminal 16b, such that the external terminal 304b is connected to the external terminal 16d and such that the external terminals 306 are connected to the terminal portion 22c. Thus, the signal line 20 is electrically connected to the central conductor 308, and the signal line 21 is connected to the central conductor 310. The ground conductors 22 and 24 are electrically connected to the external conductor 312.

The laminated multi-conductor cable 10a is preferably used in the following way. FIGS. 10A and 10B are a plan view from the y-direction and a plan view from the z-direction of an electronic device 200 using the laminated multi-conductor cable 10*a*.

The electronic device 200 includes the laminated multi-conductor cable 10*a*, a circuit board 202*a*, a liquid crystal panel 203, receptacles 404*a* and 404*b*, a battery pack (metal object) 206, and a case 210.

The circuit board 202*a* includes, for example, a drive circuit configured to drive the liquid crystal panel 203. The battery pack 206 is, for example, a lithium-ion secondary battery, and the surface of the battery pack 206 is covered by a metal cover. The circuit board 202*a*, the battery pack 206 and the liquid crystal panel 203 are arranged in this order from the negative side to the positive side in the x-direction.

The front surface of the laminate body 12 (specifically, the preventive layer 14) contacts with the battery pack 206. The front surface of the laminate body 12 is fixed to the battery pack 206 by an adhesive or the like.

The receptacles 404*a* and 404*b* are located on respective main surfaces of the circuit board 202*a* and the liquid crystal panel 203 at the negative z-direction side. The connectors 300*a* and 300*b* are connected to the receptacles 404*a* and 404*b* respectively. Thus, a high-frequency signal having a frequency, for example, within a range of about 0.8 GHz to about 5 GHz, for example, transmitted between the circuit board 202*a* and the liquid crystal panel 203 is applied to the central conductors 308 of the connectors 300*a* and 300*b* through the receptacles 404*a* and 404*b*. Also, a high-frequency signal having a frequency, for example, within a range of about 0.8 GHz to about 5 GHz, for example, transmitted between the circuit board 202*a* and the liquid crystal panel 203 is applied to the central conductors 310 of the connectors 300*a* and 300*b* through the receptacles 404*a* and 404*b*. These two high-frequency signals have an opposite phase to each other, that is, have a phase difference of 180 degrees from each other, and are to be differential-transmitted. The respective external terminals 312 of the connectors 300*a* through 300*d* are maintained at the ground potential through the circuit board 202*a*, the liquid crystal panel 203 and the receptacles 404*a* and 404*b*. In this way, the laminate multi-conductor cable 10*a* connects the circuit board 202*a* and the liquid crystal panel 203 to each other.

The main surface of the battery pack 206 at the negative z-direction side is on a different level from the receptacles 404*a* and 404*d*. Therefore, the both end portions of the line portion 12*a* of the laminate body 12 are bent such that the connectors 300*a* and 300*b* are configured to be connected to the receptacles 404*a* and 404*b*, respectively.

As in the laminated multi-conductor cable 10, in the laminated multi-conductor cable 10*a*, the ground conductor 22 has the openings 30 arranged over the signal line 20, and the ground conductor 24 has the openings 31 arranged over the signal line 21. This arrangement permits both ensuring of isolation and thinning of the laminate body 12.

Also, as in the laminated multi-conductor cable 10, in the laminated multi-conductor cable 10*a*, the risk of radiation of low-frequency noise from the signal lines 20 and 21 is diminished or prevented.

Second Modification

Next, a laminated multi-conductor cable 10*b* according to a second modification of a preferred embodiment of the present invention is described with reference to the drawings. FIG. 11 is a plan view of the signal lines 20 and 21, and the grounding conductors 22 and 24 of the laminated multi-conductor cable 10*b* according to the second modification.

The perspective view and the exploded perspective view shown by FIGS. 1 and 2 also show the laminated multi-conductor cable 10*b*.

The laminated multi-conductor cable 10*b* is, as shown in FIG. 11, different from the laminated multi-conductor cable 10 in the shapes of the openings 30 and 31 and in the shapes of the signal lines 20 and 21.

With regard to each of the openings 30 and 31, the center portion with respect to the x-direction is referred to as an area a1. The end portion at the negative x-direction side is referred to as an area a2, and the end portion at the positive x-direction side is referred to as an area a3. The area between the area a1 and the area a2 is referred to as an area a4, and the area between the area a1 and the area a3 is referred to as an area a5.

As shown in FIG. 11, the width (size in the y-direction) of each of the openings 30 in the area a1 is W1. The width of each of the openings 30 in the areas 2 and 3 is W2 smaller than W1. In the area a4, the width of each of the openings 30 increases continuously as progressing in the positive x-direction. In the area a5, the width of each of the openings 30 decreases continuously as progressing in the positive x-direction.

As shown in FIG. 11, the width (size in the y-direction) of each of the openings 31 in the area a1 is W1. The width of each of the openings 31 in the areas 2 and 3 is W2 smaller than W1. In the area a4, the width of each of the openings 31 increases continuously as progressing in the positive x-direction. In the area a5, the width of each of the openings 31 decreases continuously as progressing in the positive x-direction.

The line width of the signal line 20, as shown in FIG. 11, changes cyclically. The line width W3 of the signal line 20 at the portions crossing the openings 30 is greater than the line width W4 of the signal line 20 at the portions covered by the bridges 32. In each of the portions of the signal line 20 crossing the openings 30, the line width of the end portion at the negative x-direction side increases continuously as progressing in the positive x-direction. In each of the portions of the signal line 20 crossing the openings 30, the line width of the end portion at the positive x-direction side decreases continuously as progressing in the positive x-direction.

The line width of the signal line 21, as shown in FIG. 11, changes cyclically. The line width W3 of the signal line 21 at the portions crossing the openings 31 is greater than the line width W4 of the signal line 21 at the portions covered by the bridges 33. In each of the portions of the signal line 21 crossing the openings 31, the line width of the end portion at the negative x-direction side increases continuously as progressing in the positive x-direction. In each of the portions of the signal line 21 crossing the openings 31, the line width of the end portion at the positive x-direction side decreases continuously as progressing in the positive x-direction.

In the laminated multi-conductor cable 10*b* having the structure above, as in the laminated multi-conductor cable 10, the ground conductor 22 has the openings 30 arranged over the signal line 20, and the ground conductor 24 has the openings 31 arranged over the signal line 21. This arrangement permits both ensuring of isolation and thinning of the laminate body 12.

Also, as in the laminated multi-conductor cable 10, in the laminated multi-conductor cable 10*a*, the risk of radiation of low-frequency noise from the signal lines 20 and 21 is diminished or prevented.

In the laminated multi-conductor cable 10b, the width W1 of the openings 30 and 31 in the areas a1 is greater than the width W2 of the openings 30 and 31 in the areas a2 and a3. Accordingly, the capacitance generated between the signal line 20 and the ground conductor 22 in the areas a1 and the capacitance generated between the signal line 21 and the ground conductor 24 in the areas a1 is smaller than the capacitance generated between the signal line 20 and the ground conductor 22 in the areas a2 and a3 and the capacitance generated between the signal line 21 and the ground conductor 24 in the areas a2 and a3. Therefore, the characteristic impedance of the signal line 20 in the areas a1 is greater than the characteristic impedance of the signal line 20 in the areas a2 and a3, and the characteristic impedance of the signal line 21 in the areas a1 is greater than the characteristic impedance of the signal line 21 in the areas a2 and a3. Thus, within each of the openings 30, the characteristic impedance of the signal line 20 increases gradually and thereafter decreases gradually as progressing in the positive x-direction, and within each of the openings 31, the characteristic impedance of the signal line 21 increases gradually and thereafter decreases gradually as progressing in the positive x-direction. Thus, the risks that high-frequency signals may reflect in the signal lines 20 and 21 are diminished or prevented.

In the laminated multi-conductor cable 10b, the width of each of the openings 30 and 31 changes continuously in the areas a4 and a5. Accordingly, the gap between the signal line 20 and the ground conductor 22 in the areas a4 and a5 increases or decreases gradually, and the gap between the signal line 21 and the ground conductor 24 in the areas a4 and a5 increases or decreases gradually. Therefore, in the areas a4 and a5, the magnetic flux generated around the signal line 20 and passing through the gap between the signal line 20 and the ground conductor 22 increases or decreases gradually. In the areas a4 and a5, the magnetic flux generated around the signal line 21 and passing through the gap between the signal line 21 and the ground conductor 24 increases or decreases gradually. Thus, large fluctuations of magnetic energy in the areas a4 and a5, are avoided. Consequently, the risk that the high-frequency signal may reflect near the border between the area a1 and the area a2 and near the border between the area a1 and the area a3 is diminished or prevented.

Within each of the openings 30, since the signal line and the ground conductor 22 do not face each other, the capacitance generated between the signal line 20 and the ground conductor 22 is very small. Accordingly, increasing the line width of the signal line 20 within each of the openings 30 causes almost no increase in capacitance between the signal line 20 and the ground conductor 22 and results in almost no decrease in characteristic impedance. For this reason, the line width W3 of the signal line 20 at the portions crossing the openings 30 is greater than the line width W4 of the signal line at the portions covered by the bridges 32. Thus, the resistance of the signal line 20 can be made smaller, and the high-frequency resistance of the laminated multi-conductor cable 10b is significantly reduced. Further, for the same reason, the resistance of the signal line 21 is made smaller.

Third Modification

Figure 12:
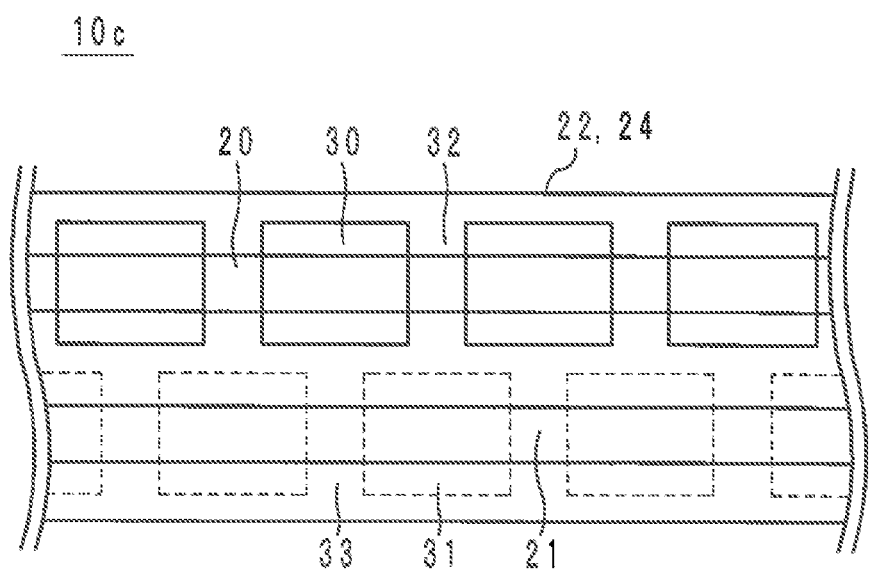
FIG. 12 is a plan view of signal lines and ground conductors of a laminated multi-conductor cable according to a third modification of a preferred embodiment of the present invention.

Next, a laminated multi-conductor cable 10c according to a third modification of a preferred embodiment of the present invention is described with reference to the drawings. FIG. 12 is a plan view of the signal lines 20 and 21, and the ground conductors 22 and 24 of the laminated multi-conductor cable 10c according to the third modification. The perspective view and the exploded perspective view shown by FIGS. 1 and 2 also show the laminated multi-conductor cable 10c.

The laminated multi-conductor cable 10c is different from the laminated multi-conductor cable 10 in that the openings 31 are arranged in different positions from the openings 30 when viewed from the y-direction. Specifically, the bridges 32 are located in the centers of the openings 31 with respect to the x-direction (the extending direction of the signal line 20). The bridges 33 are located in the centers of the openings 30 with respect to the x-direction (the extending direction of the signal line 21).

In the laminated multi-conductor cable 10c having this structure, as in the laminated multi-conductor cable 10, the ground conductor 22 has the openings 30 arranged over the signal line 20, and the ground conductor 24 has the openings 31 arranged over the signal line 21. This arrangement permits both ensuring of the isolation and thinning of the laminate body 12.

In the laminated multi-conductor cable 10c, also, as in the laminated multi-conductor cable 10, the risk of radiation of low-frequency noise from the signal lines 20 and 21 is diminished or prevented.

In the laminated multi-conductor cable 10c, isolation is secured also for the following reason. Specifically, in the laminated multi-conductor cable 10c, the characteristic impedance Z1 of the signal line 20 at the portions crossing the openings 30 is higher than the characteristic impedance Z2 of the signal line 20 at the portions covered by the bridges 32. Therefore, when a high-frequency signal is transmitted on the signal line 20, the portions of the signal line 20 crossing the openings 30 define and serve as antinodes where the voltage has the maximum amplitude, and the portions of the signal line 20 covered by the bridges 32 define and serve as nodes where voltage has the minimum amplitude. For the same reason, the portions of the signal line 21 crossing the openings 31 define and serve as antinodes where the voltage has the maximum amplitude, and the portions of the signal line 21 covered by the bridges 33 define and serve as nodes where voltage has the minimum amplitude.

In the laminated multi-conductor cable 10c, as described above, the bridges 32 are located at the centers of the openings 31 with respect to the x-direction. Therefore, the nodes on the signal line 20 and the antinodes on the signal line 21 are adjacent to each other in the y-direction. In the laminated multi-conductor cable 10c, also, the bridges 33 are located at the centers of the openings 30 with respect to the x-direction. Therefore, the antinodes on the signal line 21 and the nodes on the signal line 20 are adjacent to each other in the y-direction. At the nodes on the signal lines 20 and 21, the potential hardly changes. Accordingly, the potential changes at the nodes on the signal lines 20 and 21 affect almost no potential changes at the antinodes on the signal lines 20 and 21, and the potential changes at the nodes on the signal lines 20 and 21 are hardly affected by the potential changes at the antinodes on the signal lines 20 and 21. Thus, potential changes of the signal line 20 and potential changes of the signal line 21 do not interact with each other. Consequently, in the laminated multi-conductor cable 10c, isolation is secured.

Fourth Modification

Figure 13:
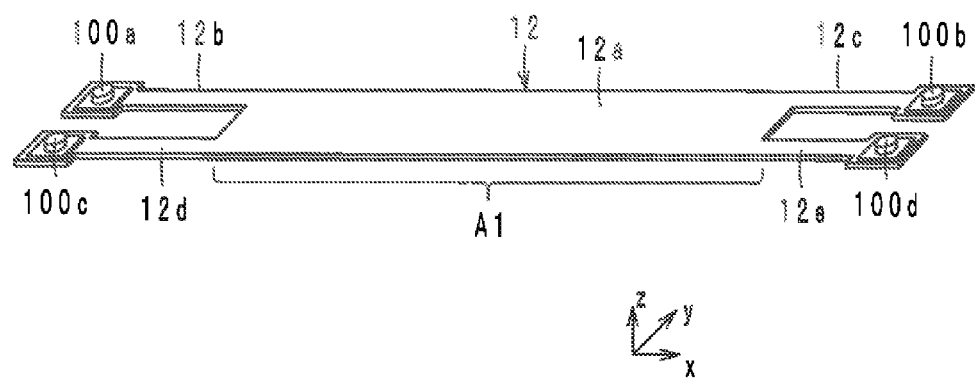
FIG. 13 is a perspective view of a laminated multi-conductor cable according to a fourth modification of a preferred embodiment of the present invention.

Next, a laminated multi-conductor cable 10d according to a fourth modification of a preferred embodiment of the present invention is described with reference to the drawings. FIG. 13 is a perspective view of the laminated multi-conductor cable 10d according to the fourth modification.

Figure 14:
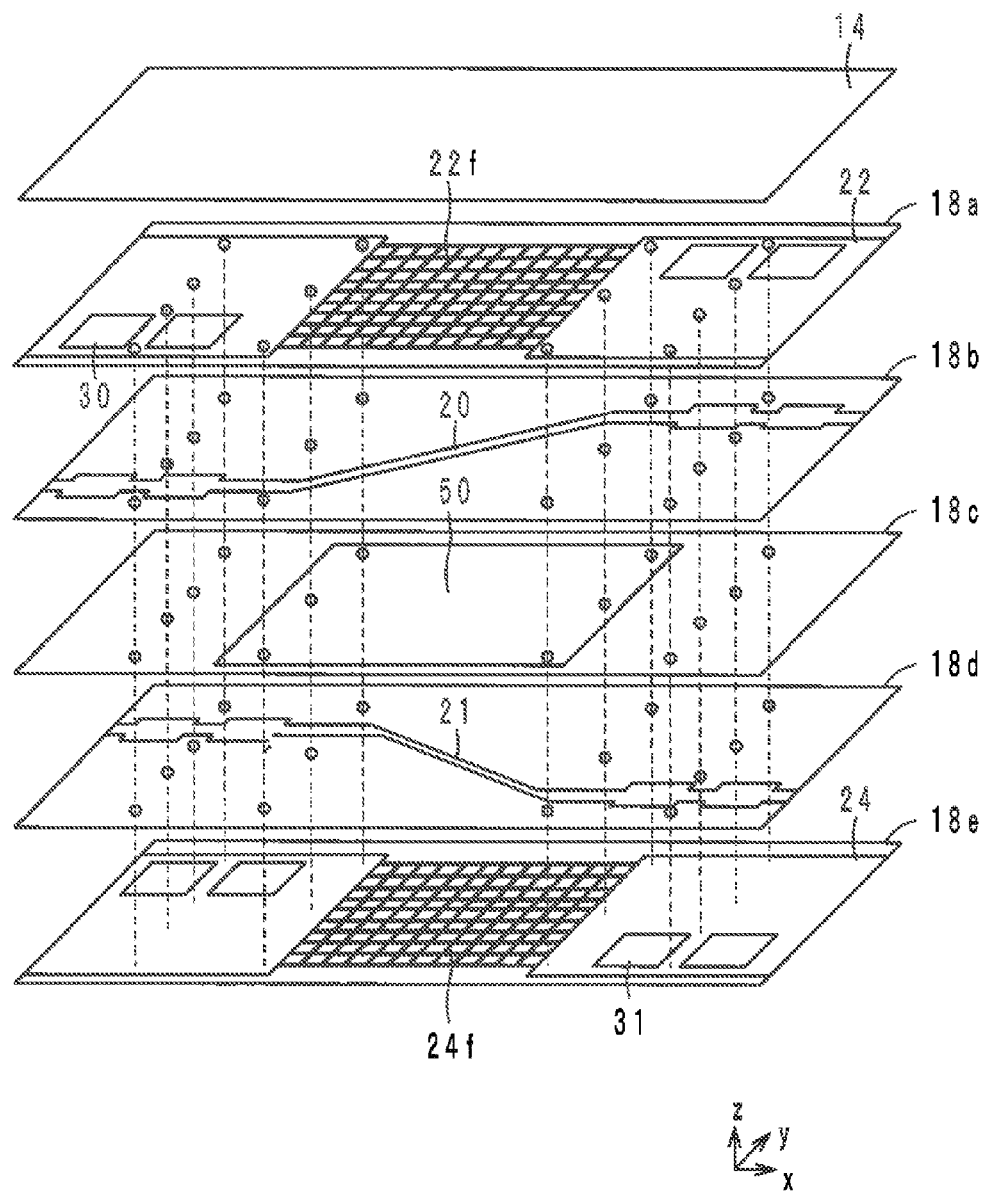
FIG. 14 is an exploded perspective view of a parallel-lines area of the laminated multi-conductor cable according to the fourth modification of a preferred embodiment of the present invention.

FIG. 14 is an exploded perspective view of a parallel-lines area A1 of the laminated multi-conductor cable 10d according to the fourth modification.

The laminate body 12 of the laminated multi-conductor cable 10d, as shown in FIG. 13, extends in the x-direction, and each of the end portions in the positive and negative x-direction are branched into two. As shown in FIG. 14, the laminate body 12 is a flexible laminate body including a preventive layer 14 and dielectric sheets (base material layers) 18a through 18e laminated in this order from the positive side to the negative side in the z-direction. A main surface of the laminate body 12 at the positive z-direction side is hereinafter referred to as a front surface, and a main surface of the laminate body at the negative z-direction side is hereinafter referred to as a back surface.

The dielectric sheets 18a through 18e, when viewed from the z-direction, have the same shape as the laminate body 12. The dielectric sheets 18a through 18e are formed of thermoplastic resin such as polyimide or the like. The thicknesses after lamination of the dielectric sheets 18a through 18e preferably are, for example, within a range of about 25 µm to about 200 µm. A main surface of each of the dielectric sheets 18a through 18e at the positive z-direction side is hereinafter referred to as a front surface, and a main surface of each of the dielectric sheets 18a through 18e at the negative z-direction side is hereinafter referred to as a back surface.

The ground conductor 22 (first ground conductor) is, as shown in FIG. 14, provided in the laminate body 12, and more specifically, provided on the front surface of the dielectric sheet 18a. The ground conductor 22, when viewed from the z-direction, has the same or substantially the same shape as the laminate body 12. The ground conductor 22 is formed of a metal material with a low specific resistance, for example, a silver-based or copper-based material.

The ground conductor 24 (second ground conductor) is, as shown in FIG. 14, provided in the laminate body 12 and located on a different layer from the ground conductor 22. More specifically, the ground conductor 24 is provided on the front surface of the dielectric sheet 18e. The ground conductor 24, when viewed from the z-direction, has the same or substantially the same shape as the laminate body 12. The ground conductor 24 is formed of a metal material with a low specific resistance, for example, a silver-based or copper-based material.

The signal line 20 is, as shown in FIG. 14, located between the ground conductor 22 and the ground conductor 24 with respect to the z-direction, and more specifically provided on the front surface of the dielectric sheet 18b. The signal line 20 is, when viewed from the z-axis direction, covered by the ground conductors 22 and 24. Therefore, the signal line 20 and the ground conductors 22 and 24 define a stripline structure. The signal line 20 is formed of a metal material with a low specific resistance, for example, a silver-based or copper-based material.

The signal line 21 is, as shown in FIG. 14, located between the ground conductor 22 and the ground conductor 24 with respect to the z-direction, and the signal line 21 is located closer to the ground conductor 24 than the signal line 20 is. More specifically, the signal line 21 is provided on the front surface of the dielectric sheet 18d. When viewed from the z-direction, the signal line 21 extends along the signal line 20 in the parallel-lines area A1. However, when viewed from the z-direction, the signal lines 20 and 21 cross each other in the center of the parallel-lines area A1 with respect to the x-direction.

The ground conductors 22, as shown by FIG. 14, includes a plurality of rectangular or substantially rectangular openings 30. The plurality of openings 30 are, when viewed from the z-direction, located over and arranged along the signal line 20.

The ground conductor 22 further includes a meshed portion 22f arranged to cover the intersection area where the signal lines 20 and 21 cross each other when viewed from the z-direction. In the same way, the ground conductor 24 includes a meshed portion 24f arranged to cover the intersection area where the signal lines 20 and 21 cross each other when viewed from the z-direction. Each of the meshed portions 22f and 24f is a meshed net including linear conductors extending in the z-direction and linear conductors extending in the y-direction.

The laminate multi-conductor cable 10d further includes a ground conductor 50. The ground conductor 50 is located to cover the intersection area where the signal lines 20 and 21 cross each other when viewed from the z-direction and is located between the signal lines 20 and 21 with respect to the z-direction. More specifically, the ground conductor 50 is provided on the front surface of the dielectric sheet 18c. The ground conductor 50 is connected to the ground conductors 22 and 24 through via-holes.

The preventive layer 14 covers substantially the entire front surface of the dielectric sheet 18a. Accordingly, the preventive layer 14 covers the ground conductor 22. The preventive layer 14 is formed of flexible resin, for example, a resist material.

There is no other structural difference between the laminated multi-conductor cable 10d and the laminated multi-conductor cable 10, and descriptions of the other components of the laminated multi-conductor cable 10d are omitted.

The laminated multi-conductor cable 10d is preferably used in the following way. FIG. 15 is a plan view from the z-direction of an electronic device 200 using the laminated multi-conductor cable 10d.

The electronic device 200 includes the laminated multi-conductor cable 10d, circuit boards 202a and 202b, a battery pack (metal object) 206, a case 210 and an antenna 212.

The battery pack 206 is, for example, a lithium-ion secondary battery, and the surface of the battery pack 206 is covered by a metal cover. The circuit board 202a, the battery pack 206 and the circuit board 202b are arranged in this order from the negative side to the positive side in the x-direction. The antenna 212 is connected to the circuit board 202a.

The laminated multi-conductor cable 10d connects the circuit boards 202a and 202b to each other. The front surface of the laminate body 12 (specifically, the preventive layer 14) contacts with the battery pack 206. The front surface of the laminate body 12 is fixed to the battery pack 206 by an adhesive or the like.

In the laminated multi-conductor cable 10d having the structure above, as in the laminated multi-conductor cable 10, the ground conductor 22 has the openings 30 arranged over the signal line 20, and the ground conductor 24 has the openings 31 arranged over the signal line 21. This arrangement permits both ensuring of isolation and thinning of the laminate body 12.

In the laminated multi-conductor cable 10d, further, as in the laminated multi-conductor cable 10, the risk of radiation of low-frequency noise from the signal lines 20 and 21 is diminished or prevented.

In the laminated multi-conductor cable 10d, the ground conductor 50 is located to cover the intersection area where the signal lines 20 and 21 cross each other when viewed from the z-direction and located between the signal lines 20 and 21 with respect to the z-direction. Thus, isolation between the signal lines 20 and 21 is secured.

In the laminated multi-conductor cable 10d, further, the meshed portions 22f and 24f are provided in the intersection area where the signal lines 20 and 21 cross each other when viewed from the z-direction. With this arrangement, in the intersection area where the signal lines 20 and 21 cross each other, less capacitance is generated between the signal line 20 and the meshed portion 22f and between the signal line 21 and the meshed portion 24f. Therefore, in this area, the line widths of the signal lines 20 and 21 are made greater. Consequently, the resistance values of the signal lines 20 and 21 are made smaller, and the high-frequency resistance of the laminated multi-conductor cable 10d is reduced.

Fifth Modification

Figure 16:
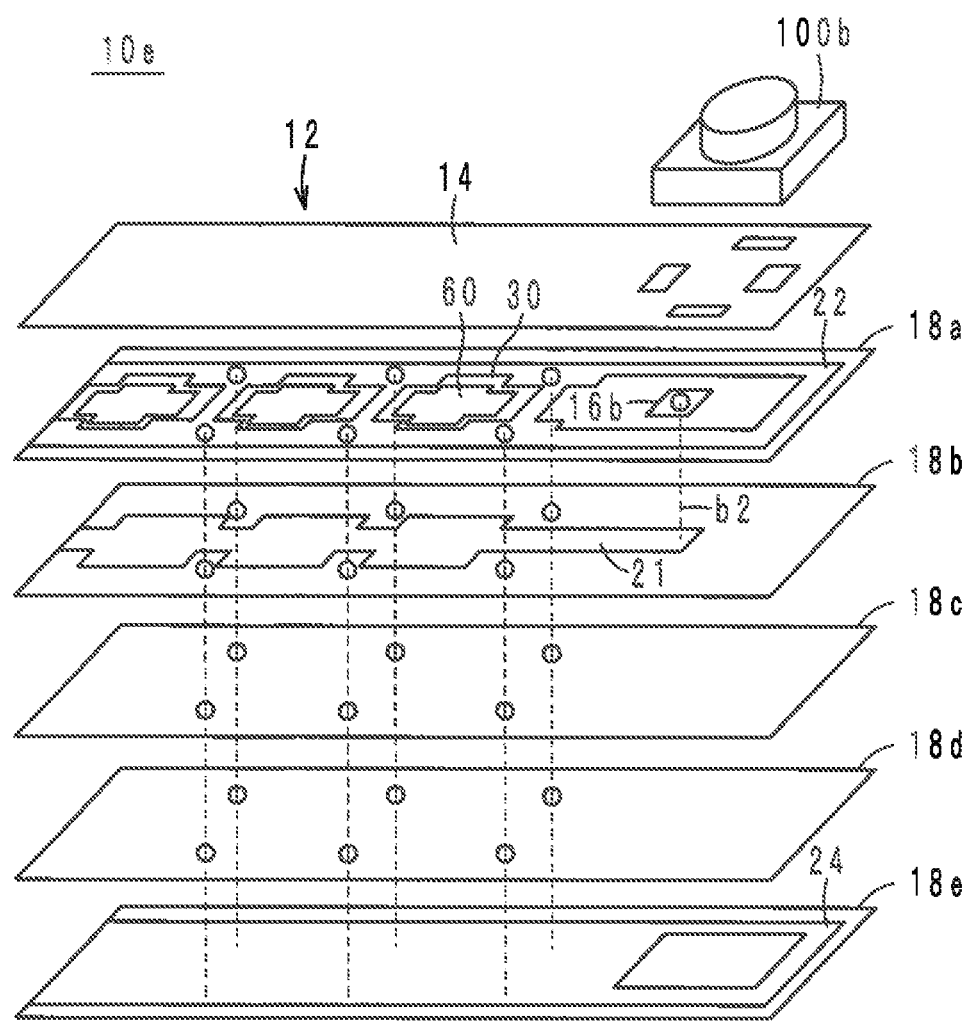
FIG. 16 is an exploded perspective view of a connection portion of a laminated multi-conductor cable according to a fifth modification of a preferred embodiment of the present invention.

Next, a laminated multi-conductor cable 10e according to a fifth modification of a preferred embodiment of the present invention is described with reference to the drawings. FIG. 16 is an exploded perspective view of the connection portion 12c of the laminated multi-conductor cable 10e according to the fifth modification. The perspective view shown by FIG. 13 also shows the laminated multi-conductor cable 10e.

The laminated multi-conductor cable 10e is different from the laminated multi-conductor cable 10d in that floating conductors 60 are provided in the respective openings 30. More specifically, the floating conductors 60 are provided on the front surface of the dielectric sheet 18a and located within the respective openings 30. The floating conductors 60 are not connected to any of the signal lines 20 and 21 (the signal line 20 not shown in FIG. 16) and the grounding conductors 22 and 24, and are maintained at a floating potential. The floating potential is a potential between the potential of the signal lines 20 and 21 (the signal line 20 not shown in FIG. 16) and the ground potential.

In the laminated multi-conductor cable 10e having the structure above, as in the laminated multi-conductor cable 10, the ground conductor 22 has the openings 30 arranged over the signal line 20 (not shown in FIG. 16), and the ground conductor 24 has the openings 31 arranged over the signal line 21. This arrangement permits both ensuring of isolation and thinning of the laminate body 12.

In the laminated multi-conductor cable 10e, further, as in the laminated multi-conductor cable 10, the risk of radiation of low-frequency noise from the signal lines 20 and 21 (the signal line not shown in FIG. 16) is diminished or prevented.

The laminated multi-conductor cable 10e is bonded to the battery pack 206 such that the preventive layer 14 contacts with the battery pack 206. Accordingly the ground conductor 22 faces the battery pack 206. The floating conductors 60 provided in the openings 30 of the ground conductor 22 prevent the signal line 20 (not shown in FIG. 16) from facing the battery pack 206 through the openings 30. Thus, the risk of radiation of noise through the openings 30 is reduced. Consequently, even a change of the material of the laminate body 12 and/or a change of the distance between the signal line 20 and the battery pack 206 result in almost no changes of the signal line 20 (not shown in FIG. 16) in high-frequency characteristics.

Other Preferred Embodiments

Laminated multi-conductor cables according to the present invention are not limited to the laminated multi-conductor cables 10 and 10a through 10e of the various preferred embodiments described above, and various changes and modifications are possible within the scope of the present invention.

Figure 17:
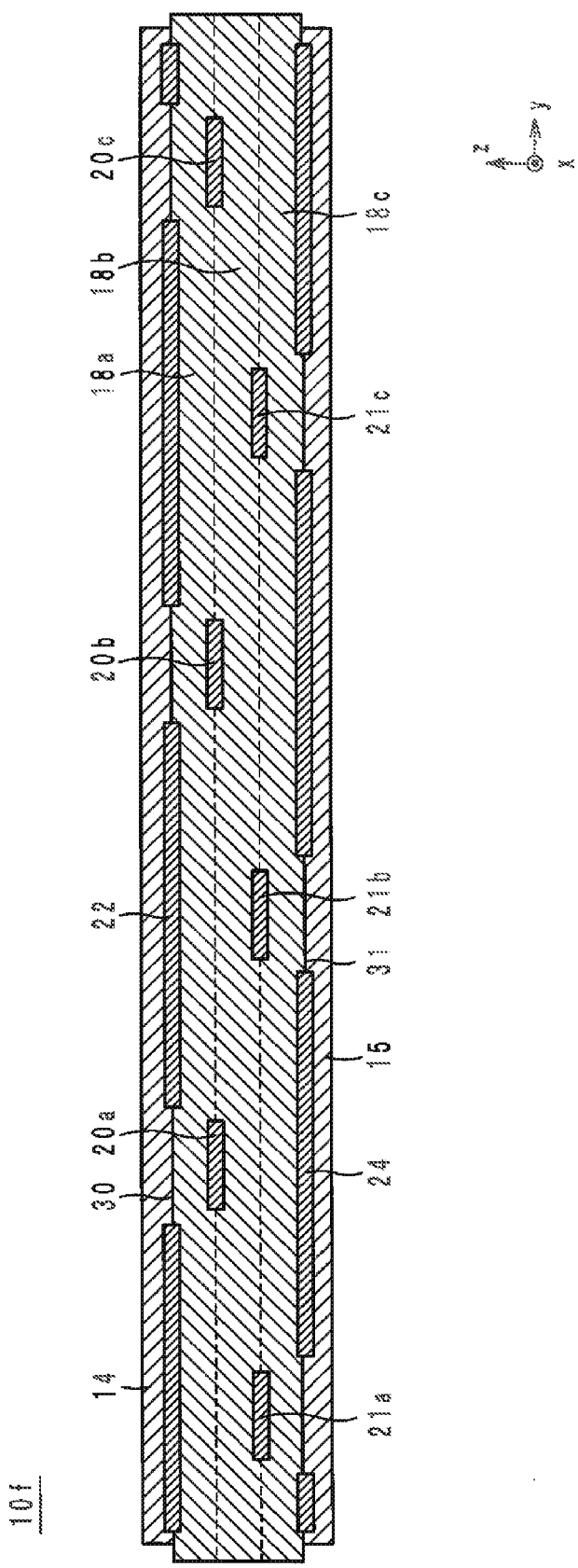
FIG. 17 is a sectional view of a laminated multi-conductor cable according to another preferred embodiment of the present invention.

FIG. 17 is a sectional view of a laminated multi-conductor cable 10f according to another preferred embodiment of the present invention. As shown in FIG. 17, it is possible to provide signal lines 20a through 20c and 21a though 21c.

Figure 18:
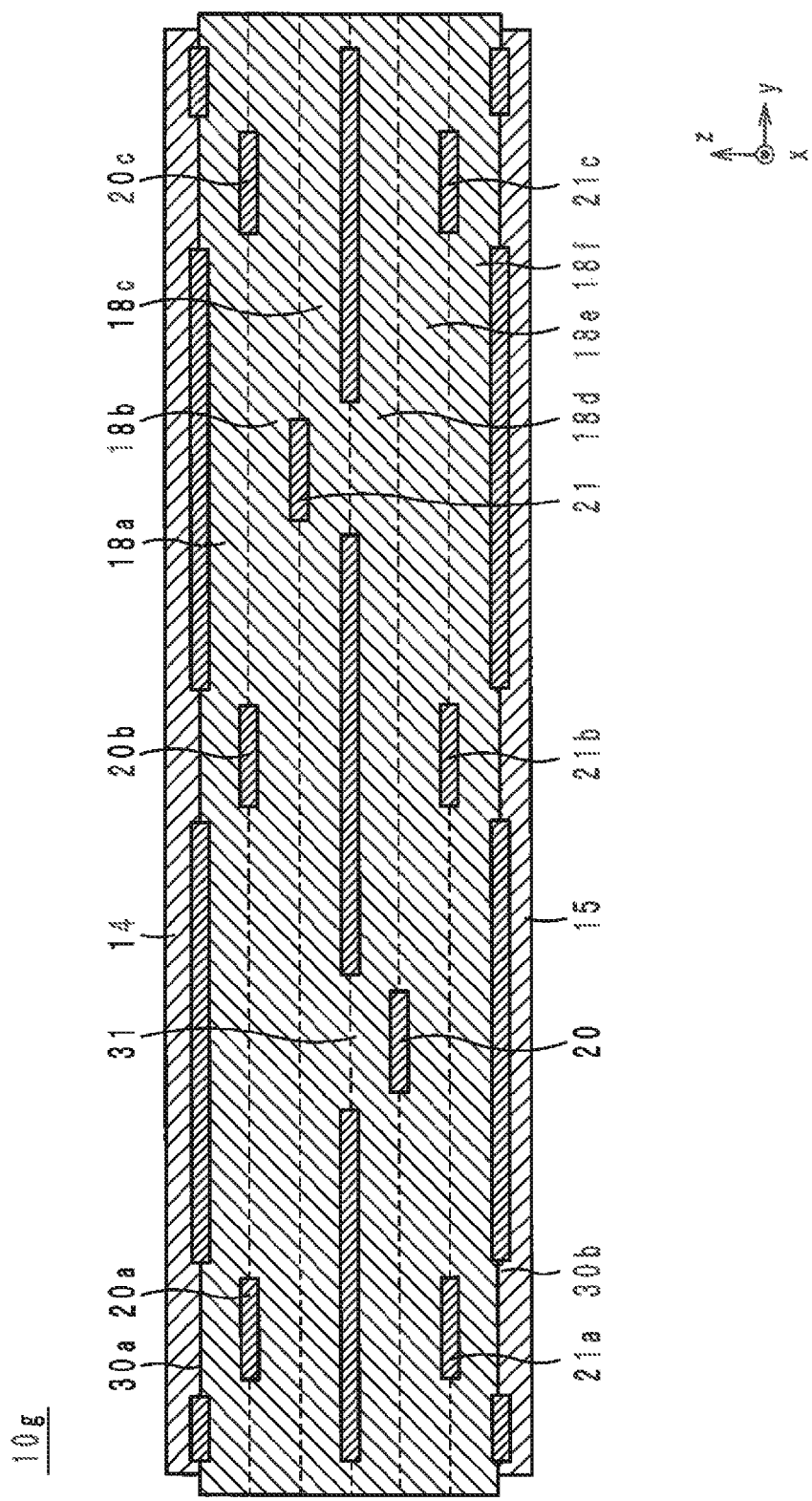
FIG. 18 is a sectional view of a laminated multi-conductor cable according to still another preferred embodiment of the present invention.
Figure 19:
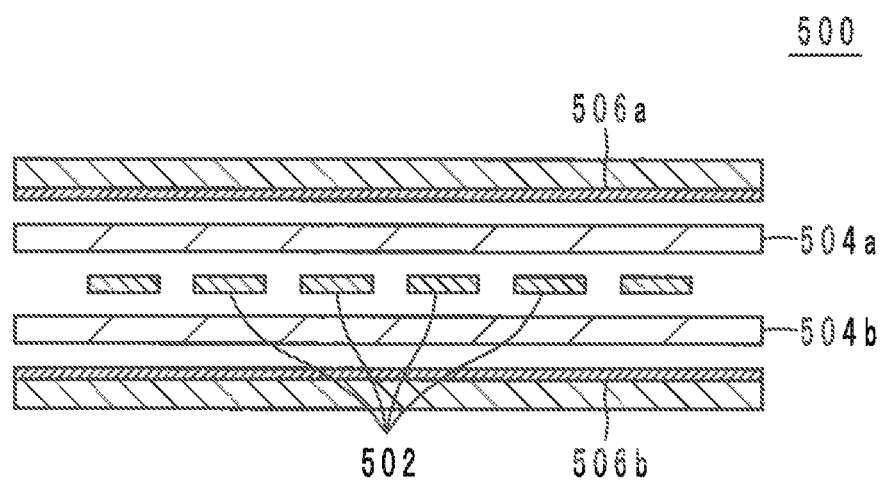
FIG. 19 is a sectional view of a flexible flat cable disclosed in Japanese Patent Laid-Open Publication No. 2009-277623.

FIG. 18 is a sectional view of a laminated multi-conductor cable 10g according to a still another preferred embodiment of the present invention. The laminated multi-conductor cable 10g, as shown by FIG. 18, has a structure where two laminated multi-conductor cables 10f are stacked in the z-direction.

Also, it is possible to combine the structures of the laminated multi-conductor cables 10 and 10a through 10e.

In each of the laminated multi-conductor cables 10 and 10a through 10e, the signal line 20 may include a portion not covered by the ground conductor 24 in a portion of the parallel-lines area A1. In other words, the signal line 20 and the ground conductor 22 may define a microstripline structure in the portion of the parallel-lines area A1. In the same way, in each of the laminated multi-conductor cables 10 and 10a through 10e, the signal line 21 may have a portion not covered by the ground conductor 22 in a portion of the parallel-lines area A1. With this arrangement, these portions of the laminate body 12 become more flexible.

Preferred embodiments of the present invention are useful in laminated multi-conductor cables, and provide the advantage of securing isolation.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A laminated multi-conductor cable comprising:
a laminate body including a plurality of base material layers laminated together;
a first ground conductor provided in or on the laminate body;
a second ground conductor provided in or on the laminate body and located on a different layer from the first ground conductor;
a first signal line provided between the first ground conductor and the second ground conductor with respect to a direction of lamination and located closer to the first ground conductor than to the second ground conductor; and
a second signal line provided between the first ground conductor and the second ground conductor with respect to the direction of lamination and located closer to the second ground conductor than the first signal line is, the second signal line extending along and not overlapping the first signal line when viewed from the direction of lamination in at least a portion of the laminate body; wherein
the first signal line, the first ground conductor, and the second ground conductor define a first stripline structure;
the second signal line, the first ground conductor, and the second ground conductor define a second stripline structure; and
the first ground conductor includes, in at least the portion of the laminate body, a first opening located over the first signal line when viewed from the direction of lamination and no openings located over the second signal line when viewed from the direction of lamination.

2. The laminated multi-conductor cable according to claim 1, wherein
the first opening includes a plurality of first openings arranged along the first signal line; and
the second ground conductor includes a second opening in at least the portion of the laminate body, the second opening being located over the second signal line when viewed from the direction of lamination.

3. The laminated multi-conductor cable according to claim 2, wherein
the first ground conductor includes a first bridge between adjacent first openings of the plurality of first openings, the first bridge being located over the first signal line when viewed from the direction of lamination;
the second opening includes a plurality of second openings arranged along the second signal line;
the second ground conductor includes a second bridge between adjacent second openings of the plurality of second openings, the second bridge being located over the second signal line when viewed from the direction of lamination;
the first bridge is located in at a center axis of one of the second openings with respect to a direction in which the first signal line extends; and
the second bridge is located in at a center axis of one of the first openings with respect to a direction in which the second signal line extends.

4. The laminated multi-conductor cable according to claim 1, wherein
when viewed from the direction of lamination, the first signal line and the second signal line cross each other in at least the portion of the laminate body; and
the laminated multi-conductor cable further includes a third ground conductor provided between the first signal line and the second signal line and located to cover crossing portions of the first signal line and the second signal line when viewed from the direction of lamination.

5. The laminated multi-conductor cable according to claim 1, wherein the laminate body is flexible.

6. The laminated multi-conductor cable according to claim 1, wherein each of the first signal line and the second signal line is a linear conductor.

7. The laminated multi-conductor cable according to claim 3, wherein the first and second bridges and the first and second openings are alternately arranged.

8. The laminated multi-conductor cable according to claim 3, wherein the first and second bridges are arranged along the first signal line at intervals shorter than about one half wavelength of a high-frequency signal to be transmitted through the first signal line.

9. The laminated multi-conductor cable according to claim 1, further comprising via hole conductors provided in the laminate body.

10. The laminated multi-conductor cable according to claim 1, further comprising a preventive layer arranged to cover one of the first ground conductor and the second ground conductor.

11. The laminated multi-conductor cable according to claim 10, wherein the preventive layer includes a line portion and connection portions.

12. An electronic device comprising the laminated multi-conductor cable according to claim 1.

13. The electronic device according to claim 12, further comprising
a plurality of circuit boards;
a plurality of receptacles;
a battery pack; and
a case.

14. The electronic device according to claim 13, wherein the laminated multi-conductor cable is arranged to connect respective ones of the plurality of circuit boards to each other.

15. The laminated multi-conductor cable according to claim 1, wherein the laminated multi-conductor cable has a rectangular or substantially rectangular shape.

16. The laminated multi-conductor cable according to claim 2, wherein widths of the plurality of first openings and the plurality of second openings are different from each other.

17. The laminated multi-conductor cable according to claim 1, wherein portions of the first signal line have different widths from each other.

18. The laminated multi-conductor cable according to claim 1, wherein at least one of the first ground conductor and the second ground conductor includes a meshed portion arranged to cover an intersection area where there first and second signal lines cross each other.

19. The laminated multi-conductor cable according to claim 2, further comprising floating conductors provided in at least one of the plurality of first openings and the plurality of second openings.

20. The laminated multi-conductor cable according to claim 1, wherein
no other ground conductors are provided between the first signal line and the first ground conductor and between the first signal line and the second ground conductor; and
no other ground conductors are provided between the second signal line and the first ground conductor and between the second signal line and the second ground conductor.

21. The laminated multi-conductor cable according to claim 1, wherein the second ground conductor includes a second opening in at least the portion of the laminate body, the second opening being located over the second signal line when viewed from the direction of lamination.

* * * * *